US012002720B2

(12) United States Patent
Cole et al.

(10) Patent No.: US 12,002,720 B2
(45) Date of Patent: Jun. 4, 2024

(54) METHODS AND SYSTEMS FOR COMPONENT ANALYSIS, SORTING, AND SEQUENCING BASED ON COMPONENT PARAMETERS AND DEVICES UTILIZING THE METHODS AND SYSTEMS

(71) Applicant: CREE FAYETTEVILLE, INC., Fayetteville, AR (US)

(72) Inventors: Zach Cole, Summers, AR (US); Morgan Andrew Roddy, Fayetteville, AR (US); John R. Fraley, Fayetteville, AR (US); Jonathan K. Hayes, Fayetteville, AR (US); Adam Benjamin Barkley, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 257 days.

(21) Appl. No.: 17/101,888

(22) Filed: Nov. 23, 2020

(65) Prior Publication Data
US 2022/0165627 A1    May 26, 2022

(51) Int. Cl.
*H01L 21/66* (2006.01)
*H01L 21/67* (2006.01)

(52) U.S. Cl.
CPC ........ *H01L 22/14* (2013.01); *H01L 21/67271* (2013.01)

(58) Field of Classification Search
CPC ............. H01L 22/14; H01L 21/67271; H01L 2224/0603; H01L 25/18; H01L 25/50; H01L 2224/49111; H01L 2224/49113; H01L 22/20; H01L 25/072; G01R 31/18; G01R 31/26; Y02T 90/167; Y04S 30/12
See application file for complete search history.

(56) References Cited

U.S. PATENT DOCUMENTS

| 4,367,932 | A | * | 1/1983 | Ishikawa | ................ | G03B 7/097 |
|           |   |   |        |          |                  | 396/245 |
| 9,839,146 | B2 |   | 12/2017 | Cole et al. | | |
| 10,665,515 | B1 | * | 5/2020 | Klein | ................ | H01L 27/11803 |
| 11,538,725 | B2 | * | 12/2022 | Domes | .................... | H01L 24/48 |
| 2002/0121811 | A1 | * | 9/2002 | Hashimoto | ........... | H02M 7/003 |
|  |  |  |  |  |  | 307/11 |

(Continued)

FOREIGN PATENT DOCUMENTS

| CN | 109712969 A | * | 5/2019 | ........... | H01L 21/565 |
| JP | 2018085858 A | * | 5/2018 | ......... | H01L 23/3672 |

(Continued)

OTHER PUBLICATIONS

Int j simul model 10 (2011) 3, 122-132 (Year: 2011).*
(Continued)

*Primary Examiner* — Jarrett J Stark
(74) *Attorney, Agent, or Firm* — BakerHostetler

(57) ABSTRACT

A process includes measuring at least one component parameter of a plurality of components with a testing device; and arranging at least a portion of the plurality of components in a sequential order based on the at least one component parameter with an implementation system in at least one of the following: a shipping format and a device implementation of the portion of the plurality of components. A system is disclosed as well.

29 Claims, 22 Drawing Sheets

(56) References Cited

U.S. PATENT DOCUMENTS

| | | | | |
|---|---|---|---|---|
| 2003/0117484 | A1* | 6/2003 | Vazan | G06K 15/1247 |
| | | | | 347/236 |
| 2004/0041868 | A1* | 3/2004 | Maru | B41J 2/2054 |
| | | | | 347/15 |
| 2004/0113869 | A1* | 6/2004 | Kato | G09G 3/006 |
| | | | | 345/46 |
| 2004/0174389 | A1* | 9/2004 | Ben-David | G09G 5/02 |
| | | | | 345/694 |
| 2008/0034337 | A1 | 2/2008 | Kuemerle et al. | |
| 2011/0062491 | A1* | 3/2011 | Nakata | H01L 25/072 |
| | | | | 257/146 |
| 2016/0198535 | A1* | 7/2016 | Ye | H05B 45/59 |
| | | | | 315/127 |
| 2016/0352101 | A1 | 12/2016 | Koo | |
| 2017/0104419 | A1* | 4/2017 | Zeng | H02M 7/003 |
| 2017/0263535 | A1* | 9/2017 | Nakano | H01L 23/48 |
| 2018/0070462 | A1 | 3/2018 | Cole et al. | |
| 2018/0206359 | A1* | 7/2018 | McPherson | H02M 7/003 |
| 2019/0160494 | A1* | 5/2019 | Linde | B07C 5/344 |
| 2023/0299070 | A1* | 9/2023 | Takahashi | H01L 27/0207 |
| | | | | 257/202 |

FOREIGN PATENT DOCUMENTS

| | | | | |
|---|---|---|---|---|
| JP | 2018107857 A | * | 7/2018 | H02M 7/003 |
| JP | 2018107858 A | * | 7/2018 | H02M 7/003 |
| WO | WO-03018346 A1 | * | 3/2003 | B60L 9/30 |
| WO | WO-2021033565 A1 | * | 2/2021 | H01L 23/053 |

OTHER PUBLICATIONS

International Search Report and Written Opinion issued in PCT/US2020/060823, dated Mar. 22, 2021; 14 pages.

Li, Helong; "Parallel Connection of Silicon Carbide MOSFETs for Multichip Power Modules"; Department of Energy Technology; Aalborg University, Denmark; 2015; 54 pages.

European Patent Application No. 20899261.0; Extended Search Report; dated Nov. 22, 2023; 8 pages.

* cited by examiner

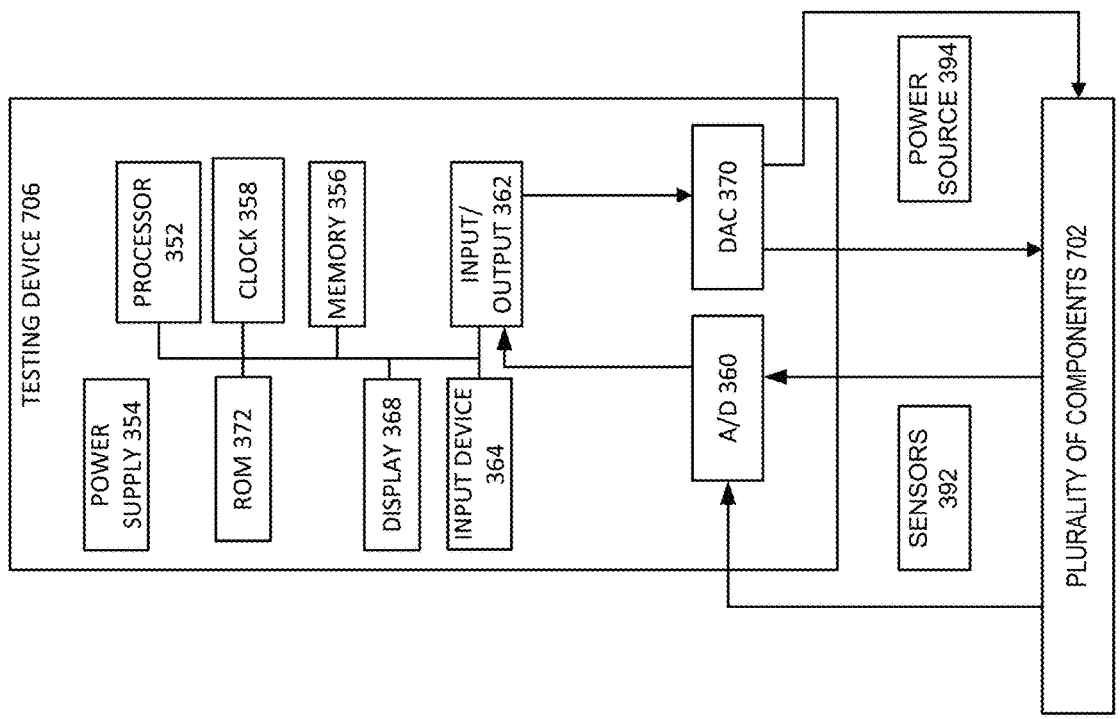

METHODS AND SYSTEMS FOR COMPONENT ANALYSIS, SORTING, AND SEQUENCING BASED ON COMPONENT PARAMETERS AND DEVICES UTILIZING THE METHODS AND SYSTEMS

BACKGROUND OF THE DISCLOSURE

Die binning is typically a way of categorizing finished dies based on their characteristics. In order to undergo die binning, manufactured dies typically require testing. Die binning allows large variances in performance to be condensed into component groups with similar ranges of characteristics. This ensures some greater level of similarity within the groups of dies.

In this regard, die binning and matching is typically required for multi-die devices, such as power modules, to ensure maximum sharing of losses between die. In particular, binning is used to control die-to-die mismatch across the semiconductor industry. This process involves selecting a subset of a wafer's die population that are electrically similar and grouping and shipping with different part numbers. Each subset is referred to as a 'Bin.' Binning creates subsets of a wafer that have tighter electrical performance distributions than the wafer/lot would have provided naturally, but this is a 'brute force' approach and has significant drawbacks.

First, the process involves creating additional part numbers which has logistical challenges and overhead costs. Second, not all bins have equal numbers of parts and some bins are 'lonely,' that is they have very few parts compared to other bins. This leads to bins that are undesirable to customers. Third, various customers of the same die may have different specifications on the electrical performance ranges of the bins. This would lead to additional part numbers needing to be generated and significantly increases the logistical oversight needed to reliability execute the binning process.

Accordingly, what is needed are processes and systems for controlling component mismatch, reducing a need for active logistical oversight, improving performance of devices implementing the components, and/or the like.

SUMMARY OF THE DISCLOSURE

One aspect of the disclosure includes a process that includes measuring at least one component parameter of a plurality of components with a testing device; and arranging at least a portion of the plurality of components in a sequential order based on the at least one component parameter with an implementation system in at least one of the following: a shipping format and a device implementation of the portion of the plurality of components.

One aspect of the disclosure includes a system that includes a testing device configured to measure at least one component parameter of a plurality of components; and an implementation system configured to arrange at least a portion of the plurality of components in a sequential order based on the at least one component parameter in at least one of the following: a shipping format and a device implementation of the portion of the plurality of components.

One aspect of the disclosure includes a power module, that includes at least one electrically conductive power substrate; a housing arranged on the at least one electrically conductive power substrate; and a plurality of power devices arranged on and connected to the at least one electrically conductive power substrate, where each of the plurality of power devices are arranged in a sequential order based on at least one component parameter.

One aspect of the disclosure includes a shipping format that includes a shipping package; and a plurality of components arranged in the shipping package in a sequential order based on at least one component parameter.

One aspect of the disclosure includes a process that includes measuring at least one component parameter of a plurality of components with a testing device; and arranging at least a portion of the plurality of components in a sequential order based on the at least one component parameter with an implementation system in a shipping format.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 14 illustrates a testing device utilized at least in part for the process according to the disclosure.

DETAILED DESCRIPTION OF THE DISCLOSURE

Figure 1:
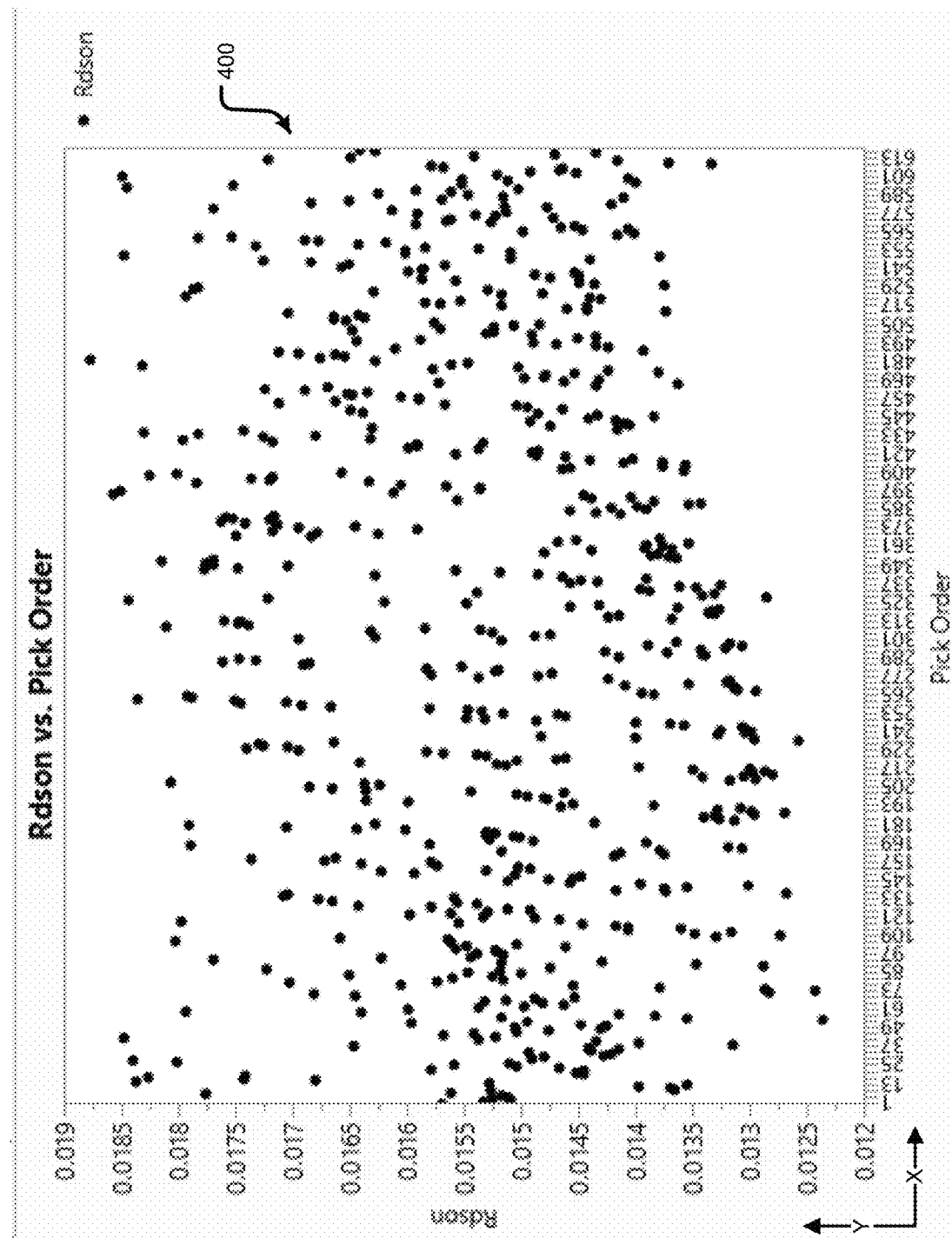
FIG. 1 is a graph illustrating data for a pick order vs an on-state resistance (Rds(on)) for prior art picking processes.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale and features of one aspect may be employed with other aspects as the skilled artisan would recognize, even if not explicitly stated herein. Descriptions of well-known components and processing techniques may be omitted to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

The disclosure is directed to methods and systems that may be used in the assembly of any device implementation containing a plurality of components. For example, the disclosed methods and systems may be used in the assembly of any power module containing multiple components such as multiple die. In broader aspects, the disclosed methods and systems may be used with any part or assembly with a measured attribute to reduce deviation of that attribute within any subgroup selected from the ordered list. In particular, the disclosed methods and systems may be used with any part or assembly with a measured attribute to reduce deviation of that attribute within any subgroup selected from a sequentially ordered list that is sequentially ordered based on the measured attribute.

The disclosure is further directed to methods and systems that may be considered a significant improvement on the idea of binning a plurality of components. For example, the disclosure is directed to methods and systems that may be considered a significant improvement on the idea of binning die based on a component parameter, such as one or more datasheet parameters (e.g., threshold voltage, on-state resistance, and/or the like), some other figure of merit (FOM) derived from a combination of die datasheet parameters (e.g., FOM=□Rds(on)+(1−□) Vth, where □ is a parameter of thermal instability), and/or the like. In this regard, these FOMs can be quite complex and even of multiple dimensions (e.g., FOM=min f(x, y, . . . , z), which may be subject to equality and inequality constraints).

In this regard, variation in component parameters from component to component may be a major source of implementation issues in a device implementation. For example, variation in threshold voltage from die to die may be a major source of ringing in a power module.

The disclosed methods and systems extend well beyond the standard binning approach of defining narrow bins within the acceptable range of component parameters, filling them from a supply, and pulling the components from a single bin to fill an implementation device. For example, the disclosed methods and systems extend well beyond the standard binning approach of defining narrow bins within the acceptable range of datasheet values, filling them from a supply, and pulling parts from a single bin to fill a power module. Having all the die data available due to wafer-level testing allows a set-up of an implementation system, such as a pick-and-place device, to populate the first power module, for example by individual switch position with die taken from the one end of a sorted list (skipping failed die, of course) and the next power module from the next part of the list, and so on. Populating power modules in this fashion may ensure the tightest grouping of devices having consistent component parameters, such as threshold voltages, within each switch position.

The disclosed methods and systems solve the problem of achieving matched component parameters within an implementation device in general. For example, the disclosed methods and systems may solve the problem of achieving matched component parameters, such as threshold voltages and/or whatever FOM is chosen, within a power module in general, or within a power module's switch position in particular.

The existing method is to use die, essentially at random, that have been tested and shown to have values that lie within the acceptable min-max range as noted in the die datasheet. This results in power modules with higher ringing, unequal current sharing among devices, unequal power losses among devices, and/or the like due to for example, unequal turn-on times, unequal turn-off times, and/or the like. Taking advantage of available knowledge of individual die characteristics when choosing which die go into what power module, power module switch position, power module switch location, and/or the like does provide a limited reduction to this problem.

The disclosed methods and systems markedly advance this concept further for an application that may benefit from having two or more device implementations with matched components or component parameters. In this regard, "matched sets" of device implementations may be produced. The disclosed methods and systems may determine the components that are matched within a device implementation. Moreover, the disclosed methods and systems may further determine all the data for the components recorded in a database in order to produce device implementations. In this regard, combining sequentially-numbered device implementations may result in matched sets of devices.

For example, the disclosed methods and systems markedly advance this concept further, from a switch position, to a power module, to sets of power modules if an application would benefit from having two or more power modules with matched values. For example, when paralleling power modules for higher current, higher power, and/or the like. Moreover, "matched sets" of power modules may be produced. The disclosed methods and systems may determine the die that are matched within a power module. Moreover, the disclosed methods and systems may further determine all the data for every power module recorded in a database in order to produce matched power modules. In this regard, combining sequentially-numbered power modules may result in matched sets of power modules.

The disclosed methods and systems may use an implementation system to move components into a shipping format or a device implementation, record keeping and traceability is highly enhanced because the implementation system can be used to automatically keep a database updated with what component is used exactly where and keep that information coupled with any test data or failure analysis efforts (from in-line testing or from field failure returns). For example, the disclosed methods and systems may use pick-and-place machines to move die, either from dicing tape or waffle packs into a shipping format such as waffle packs, device implementations such as power modules, other locations, and/or the like. Accordingly, record keeping and traceability is highly enhanced because the pick-and-place machine can be used to automatically keep a database updated with what die is used exactly where and keep that information coupled with any test data or failure analysis efforts (from in-line testing or from field failure returns). Thus, the traceability of die from lot, wafer, and wafer position can then be linked to a power module, a power module switch position, a power module switch position location, and/or the like.

The disclosed methods and systems may rank a set of components by some figure of merit and use the components in a sequence based on that ranking to populate a device implementation. In this regard, the disclosed methods and systems may utilize this sorting or ranking, which may also be thought of as the idea of "binning" devices taken to the extreme of each "bin" containing exactly one component. For example, the disclosed methods and systems may rank a set of die by some figure of merit and use them in a sequence based on that ranking to populate a module. In this regard, the disclosed methods and systems may utilize this sorting or ranking, which may also be thought of as the idea of "binning" devices taken to the extreme of each "bin" containing exactly one die.

A further example may be to probe a wafer, dice the wafer, and rank the die by a component parameter such as threshold voltage. Using the implementation system, such as pick-and-place machine, to pick the die in order by that ranking (skipping die falling completely outside the acceptable range) directly into the device implementation such as power modules.

The disclosed methods and systems may utilize sorting a group of similar items into an order based on one or more attributes that can be applied to any group, not just die on a single wafer. Entire lots of wafers could be sorted at the die level, other parts for an assembly can be similarly sorted such as pins by length as one example. Then the sorted inventories may be used in each assembly in sequential (or other) order to achieve a minimum variation of parts within each individual assembly.

The disclosed methods and systems may define a front-end to back-end methodology to parallel two or more components in a device implementation and achieve consistent static and dynamic characteristics from a lot of like components. In this way, various attributes allow the devices to operate in synchrony. For example, the disclosed methods and systems may define a front-end to back-end methodology to parallel two or more power semiconductor devices in a switch position and achieve consistent static and dynamic characteristics from a lot of like semiconductor devices. In this way, current, and thus losses, are shared equally and turn-on and turn-off of the devices in parallel are in synchrony.

In one aspect, the disclosed methods and systems may be used with a power module. A power module, in its simplest form, may include a single switch position. This is called a "single switch" power module. If the single switch position contains two or more power semiconductor devices of the same kind connected in parallel: for example, two or more MOSFETs, two or more diodes, two or more IGBTs with a single diode, two or more IGBTs with two or more diodes, two or more MOSFETs with two or more IGBTs with two or more diodes, such as a Hybrid Power Module, and/or the like then the disclosed methods and systems may provide the associated power semiconductor devices of the same kind that may be determined and connected in parallel to achieve higher ampacity, and thus greater active and/or reactive power processing capability.

The disclosed methods and systems may be generalized to power modules with an N of switch positions. The most prevalent may be a case where N=2, which may be implemented as a half-bridge, dual phase-leg power module, a single phase-leg power module, and/or the like. Moreover, the disclosed methods and systems may be utilized for a power module containing a three-phase active front end, a DC link chopper, a three-phase inverter, and/or the like.

The disclosed methods and systems may also be generalized to M power modules connected in parallel. In this case the switch position of each module in parallel may be concatenated to form one equivalent switch position.

The disclosed methods and systems may generalized to not only device implementations, such as power modules, but also to any shipping format or package of bare die. For example, a shipping format or package such as a waffle pack, a ring frame, a tape and reel, and/or the like of bare die. In this case, an end user takes advantage of the die sorted into the package by using the die in that sorted order, improving the matching of anything they build with the die, and thus their product's performance.

The disclosed methods and systems utilize sorting of the plurality of components, such as die, before they are built into a device implementation, such as multi-component power modules. To understand the value, it is important to first describe a standard process that has been used. In contrast, the disclosed methods and systems utilize component sequencing or die sequencing to massively reduce component mismatch, such as die-to-die mismatch, over the standard process.

Figure 2:
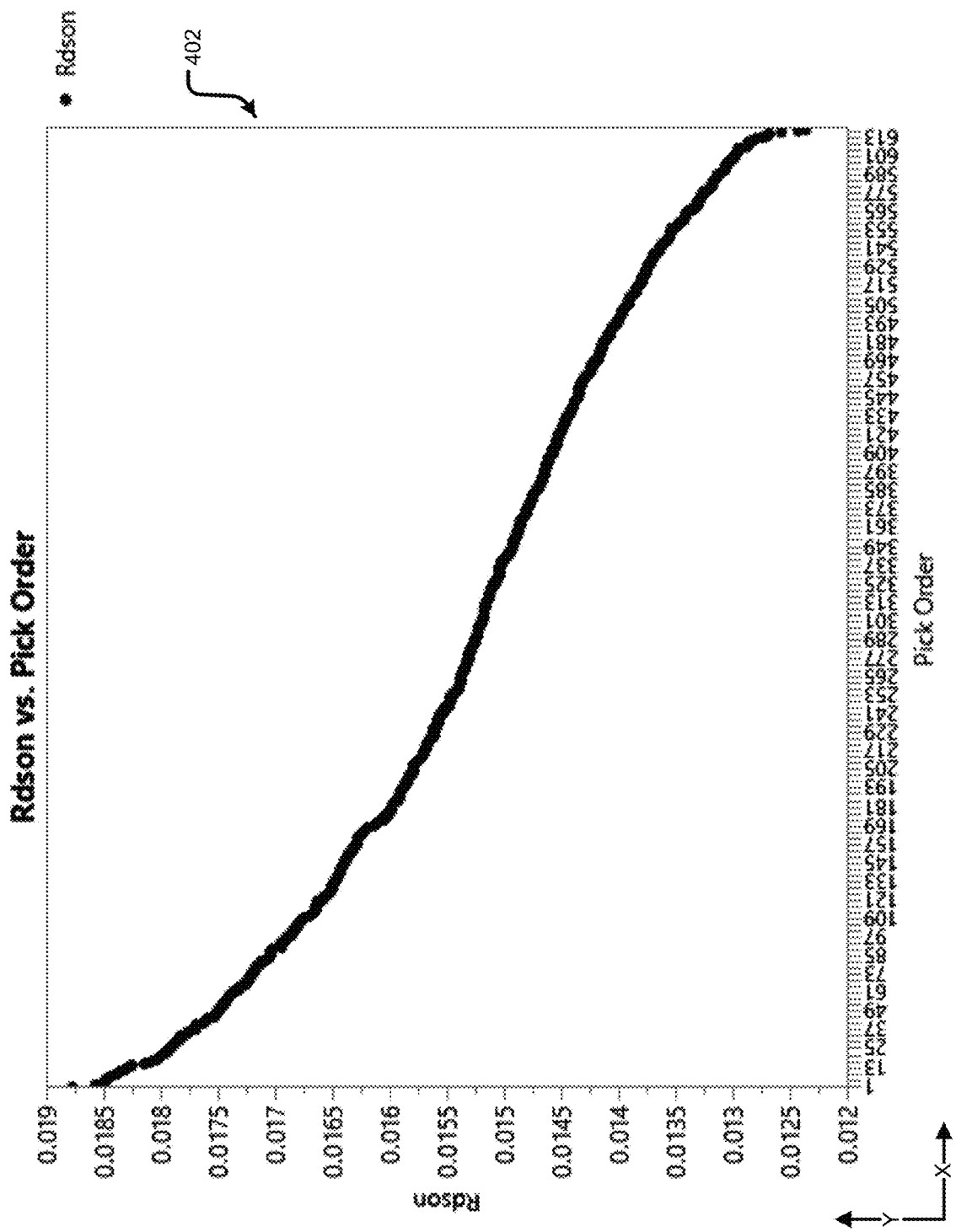
FIG. 2 is a graph illustrating data for a pick order vs an on-state resistance (Rds(on)) utilizing the disclosed methods and systems according to the disclosure.

FIG. 2 is a graph illustrating data for a pick order vs an on-state resistance (Rds(on)) for prior art picking processes.

In particular, FIG. 1 is a graph 400 illustrating data for a numerical pick order along the x-axis vs an on-state resistance (Rds(on)) in ohms along the y-axis for prior art picking processes. The prior art process of putting die into multi-component power modules is to pick die from a wafer by some geometric order (top to bottom, left to right). This means that adjacent die on a wafer become adjacent die in an end package. The problem is that position on wafer does not necessarily correlate with electrical performance and/or a component parameter. The outcome is that die that are packaged together can have undesirable mismatch (compared to their adjacent neighbors within the packaging) in electrical performance which leads to power module yield fallout, reliability impacts, reduced performance, and/or the like. An example set of data demonstrates this phenomenon is illustrated FIG. 1. The x-axis is the order in which a component, such as die, is picked from the wafer and therefore the order in which they are built into an implementation, such as power modules. The y-axis is an electrical performance parameter on-state resistance (Rds(on)).

As illustrated in FIG. 1, the numerical pick order illustrates an on-state resistance (Rds(on)) that varies greatly. More specifically, the on-state resistance (Rds(on)) based on pick order results in a scattering of performance of the adjacent components. In this regard, it is undesirable for adjacent components, such as die, to be significantly different, which the prior art process may utilize based on pick order.

FIG. 2 is a graph illustrating data for a pick order vs an on-state resistance (Rds(on)) utilizing the disclosed methods and systems according to the disclosure.

In particular, FIG. 2 is a graph 402 illustrating data for a sequenced numerical pick order along the x-axis vs an on-state resistance (Rds(on)) in ohms along the y-axis utilizing the disclosed methods and systems according to the disclosure.

As illustrated in FIG. 2, the numerical pick order illustrates an on-state resistance (Rds(on)) between two devices is minimized. The disclosed methods and systems implement a novel process and system of picking die from the wafer into an intermediate format, such as a shipping format in a sequenced order based on a component parameter such as on-state resistance (Rds(on)); the disclosed methods and systems implement novel methods and systems of picking die from the wafer into a device implementation in a sequenced order based on a component parameter such as on-state resistance (Rds(on)); and the disclosed methods and systems implement a novel process and system of picking die from the wafer into sequential device implementations in a sequenced order based on a component parameter such as on-state resistance (Rds(on)).

The shipping format may include a waffle pack shipping format, a ring frame shipping format, a tape and reel shipping format, a one-dimensional array shipping format, a two-dimensional array shipping format, a three-dimensional array shipping format, a sheet shipping format, a wafer cassette shipping format, a wafer carrier box shipping format, a gel pack shipping format, stacks of any of the above, components in tube shipping format and/or the like. Accordingly, the shipping format may be configured so that adjacent components, such as die, are electrically similar. For example, a difference in a component parameter of adjacent components may be minimized.

The device implementation may be any type of device using a plurality of components. The device implementation may be a power module, a plurality of power modules, a transceiver, a plurality of transceivers, and/or the like. Implementations of a power module of the disclosure may include one or more power modules topologies that include one or more of a switch, a bridge rectifier, a half bridge, a half bridge with inverter leg, a full bridge, an H-Bridge, a boost or power factor correction, an ANPFC (Advanced Neutral Boost Power Factor Correction), three level NPC (Neutral Point Clamp), a three level MNPC (Mixed voltage Neutral Point Clamp), a three level ANPC, a three level H6.5, a three-phase inverter, a Power Interface Module (PIM), an Intelligent Power Module (IPM), and/or the like.

The disclosed process is referred to herein as component sequencing or die sequencing. The component sequencing may be the process of picking components, such as die, from a wafer according to their electrical performance or a component parameter. For example, in a 'highest to lowest' electrical performance or component parameter order. Likewise, a lowest to highest electrical performance or component parameter may be utilized as well. Additional component sequencing orders are disclosed herein as well. In particular, the component sequencing may include an Ascending-Descending Sequencing (ADS), a Half-Sine Sequencing (HSS), or a Full-Sine Sequencing (FSS).

To accomplish this, an electrical performance mapping, a wafer probe map, and/or the like may be sorted by an electrical parameter or a component parameter, such as the exemplary on-state resistance (Rds(on)), and then a pick index may be generated and appended to the die data. In this regard, the electrical parameter or component parameter may defined herein to include one or more of a threshold voltage, an on-state resistance, a static conduction characteristic, a dynamic switching characteristic, a drain current magnitude, a transconductance, a gate threshold voltage, a gate-source leakage current, a drain-source leakage current, a drain-source on-state resistance, a total gate charge, a gate-source charge, a gate-drain charge, an input capacitance, a reverse transfer capacitance, a gate resistance, a turn-on delay time, a turn-on rise time, a turn-off delay time, a turn-off fall time, a forward voltage, a reverse recovery time, a reverse recovery charge, a turn-on drain current, a drain-source current, a gate-source voltage, a transfer function, a drain-source voltage, a pulsed drain current, a DC body diode forward current, a pulsed body diode current, a max transient voltage, a turn-off gate voltage, a power dissipation, a virtual junction temperature, a body diode thermal resistance, a thermal resistance, a body diode forward voltage, a gate-source threshold voltage, a zero-gate voltage drain current, an internal gate resistance, an output capacitance, a reverse capacitance, a stored energy, a rise time, a fall time, a turn-on energy, a turn-off energy, a total switching energy, a diode reverse recovery charge, a diode peak reverse recovery current, a resistance, a capacitance, resonant points, an inductance, transfer data, parametric data, data characterizing static losses, a device transfer curve, a transfer function, data representative of an independent scalar input versus a dependent scalar output, time domain waveforms, and/or data characterizing dynamic losses, and/or a like property that may be sequenced.

The tools that pick the die may then use this pick index as the order in which to pick die instead of simply picking by geometric location on wafer. In this regard, the representative die sample set is shown in FIG. 1, and this data set from FIG. 1 was subsequently treated with component sequencing according to the disclosure, and this new pick order that has been sequenced according to the methods and systems of the disclosure is shown in FIG. 2. As illustrated in FIG. 2, the numerical pick order illustrates an on-state resistance (Rds (on)) between two devices that is minimized. Likewise, the component sequencing can be used with any component parameter or component parameters to likewise result in a component parameter that is minimized between two adjacent devices within the pick order or component sequencing.

In particular, the disclosed methods and systems implement component sequencing for a plurality of components based on a component parameter. The plurality of components may be sequenced in order based on the component parameter such that any two adjacent ones of the plurality of components that are in the sequential order have a deviation in component parameter, a difference in component parameter, a variation in component parameter, and/or the like that is minimized, reduced, and/or the like. More generally, adjacent groups of the plurality of components in the sequential order have a deviation in a component parameter, a difference in a component parameter, a variation in a component parameter, and/or the like that is minimized, reduced, and/or the like.

Moreover, a device implementation may be built utilizing the sequential order of the plurality components. Accordingly, the device implementation may have a plurality of components with a deviation in a component parameter, a difference in a component parameter, a variation in a component parameter, and/or the like that is minimized, reduced, and/or the like.

Additionally, device implementations may be sequentially built utilizing the sequential order of the components. Accordingly, sequentially built device implementations may have a plurality of components that may have a deviation in a component parameter, a difference in a component parameter, a variation in a component parameter, and/or the like that is minimized, reduced, and/or the like.

Figure 3:
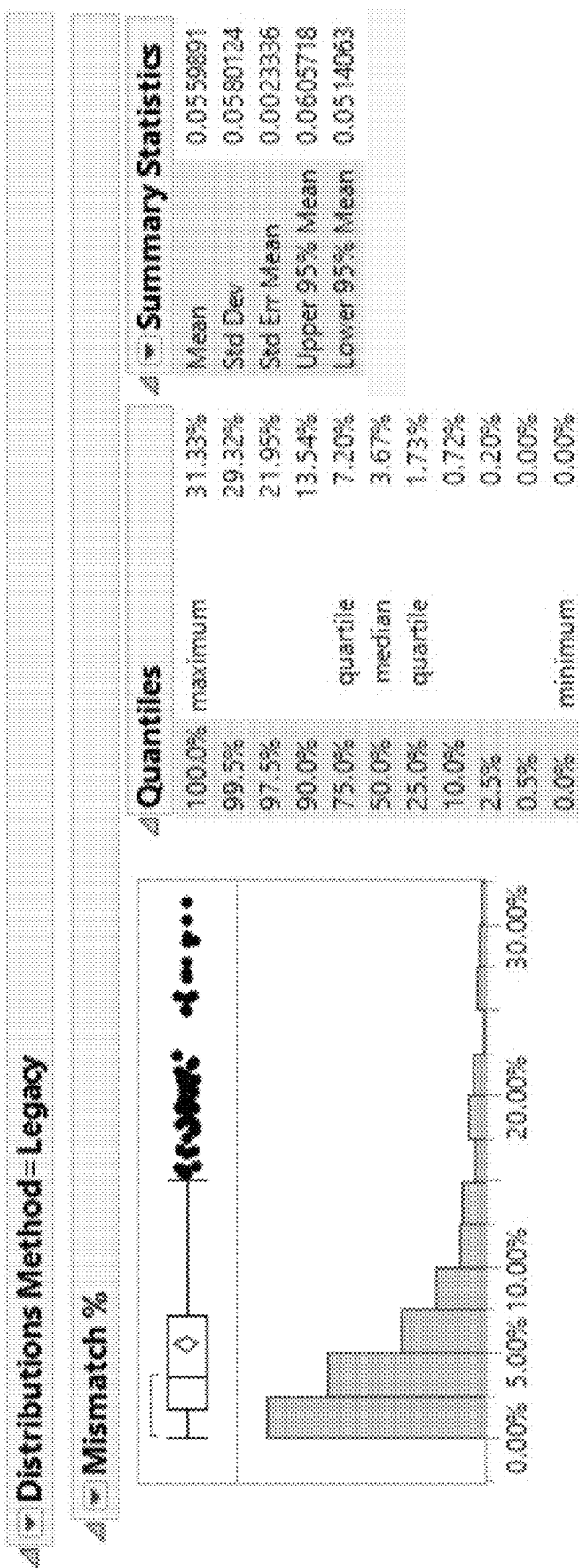
FIG. 3 illustrates mismatch distribution data for the prior art process associated with FIG. 1.

FIG. 3 illustrates mismatch distribution data for the prior art process associated with FIG. 1.

In this regard, FIG. 3 illustrates that the median value of the sample results in a 3.67% mismatch for the pick order illustrated in FIG. 1. Additional values illustrated in FIG. 3 show substantial mismatch issues that are addressed by the disclosed processes and systems.

Figure 4:
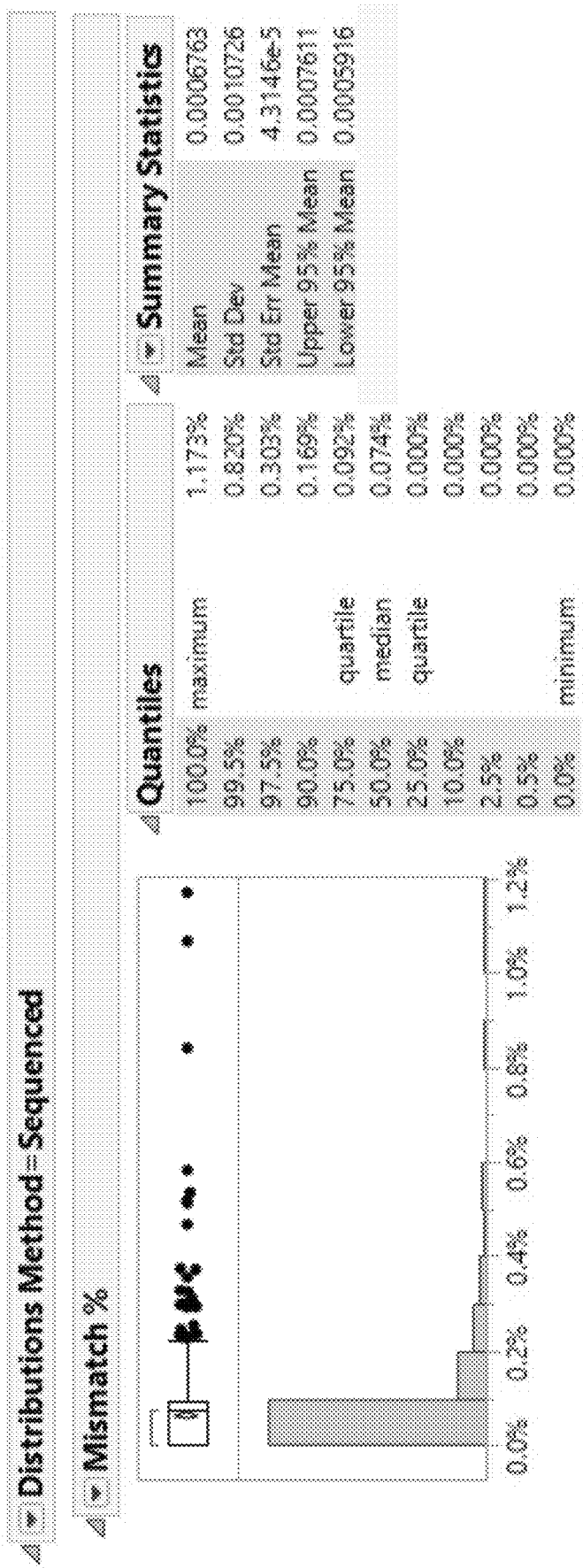
FIG. 4 illustrates mismatch distribution data utilizing the disclosed methods and systems according to the disclosure according to FIG. 2.

FIG. 4 illustrates mismatch distribution data utilizing the disclosed methods and systems according to the disclosure according to FIG. 2.

In this regard, FIG. 4 illustrates that the median value of the sample results in a 0.74% mismatch utilizing the disclosed methods and systems. Additional values illustrated in FIG. 4 show vast improvement in reducing mismatch issues that are addressed by the disclosed processes and systems.

Figure 5:
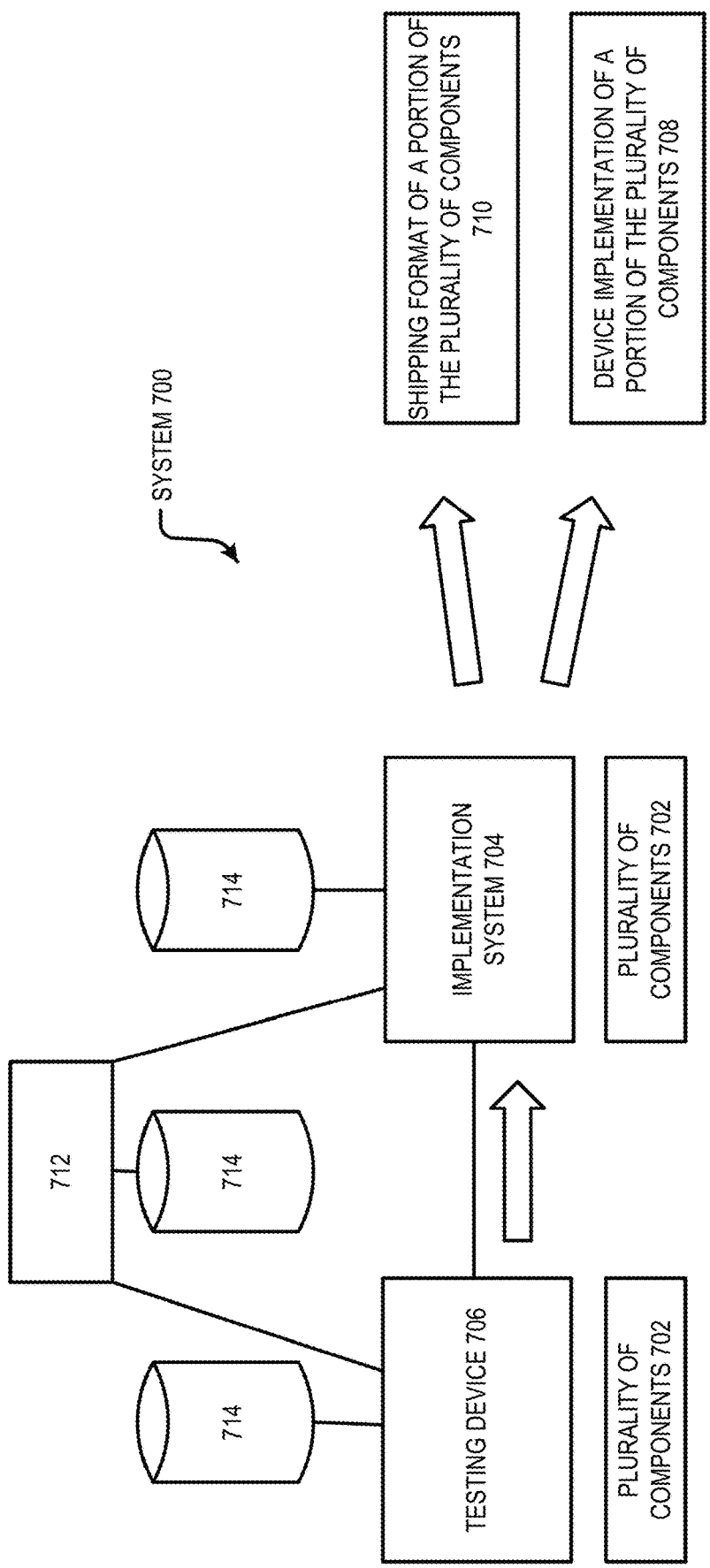
FIG. 5 illustrates a system according to the disclosure.

FIG. 5 illustrates a system according to the disclosure.

In particular, FIG. 5 illustrates a system 700 that may implement one or more of component analysis, sorting, and/or sequencing based on component parameters. The system 700 may include a testing device 706 and an implementation system 704.

The testing device 706 may test a plurality of components 702. In particular, the testing device 706 may test the plurality of components 702 that are not sequenced. More specifically, the testing device 706 may test the plurality of components 702 in order to obtain data for subsequent sequencing of the plurality of components 702. The testing device 706 may be implemented as one or more of a probe, an end of line device, a wafer prober, a curve tracer, a wafer-level probe, and/or the like.

The implementation system 704 may be implemented as one or more of a pick and place device, a die sorter, a die handler, a robotic system, and a packaging system. The implementation system 704 may sequence the plurality of components 702 based on the data from the testing device 706. In this regard, the implementation system 704 may sequence the plurality of components 702 for a device implementation 708 of a portion of the plurality of components 702; and/or the implementation system 704 may sequence the plurality of components 702 for a shipping format 710 of a portion of the plurality of components 702.

The implementation system 704 may be a component placement system that may be a robotic machine configured to move the plurality of components 702. The implementation system 704 may be configured for high speed, high precision placing of the plurality of components 702. The implementation system 704 may include actuation devices, sensing devices, manipulation devices, and/or the like. The implementation system 704 may include a processor, a memory, a display, a power supply, a read-only memory, an input device, an input/output device, an analog-to-digital converter, a digital to analog converter, a clock, one or more sensors, a power source, and/or the like. The processor may be configured to process at least in part sequencing functions, picking functions, implement the component sequencing process 200, and/or the like.

Although the system 700 illustrates implementation of the testing device 706 and the implementation system 704, the system 700 may implement additional devices, dedicated hardware 712, computer hardware, and/or the like. Moreover, one or more functions of the testing device 706 as described herein may be implemented by the implementation system 704. Likewise, one or more functions of the implementation system 704 as described herein may be implemented by the testing device 706. Additionally, one or more functions of the testing device 706 as described herein may be implemented by additional devices, the dedicated hardware 712, computer hardware, and/or the like. Moreover, one or more functions of the implementation system 704 as described herein may be implemented by additional devices, the dedicated hardware 712, computer hardware, and/or the like. The system 700 may further include a database 714. The database 714 may be associated with the testing device 706, the implementation system 704, the dedicated hardware 712, and/or the like. Additionally, one or more of the testing device 706, the implementation system 704, and the dedicated hardware 712 may be configured with wired or wireless connections for transferring data, information, and/or the like therebetween. The data, the information, and/or the like may include data on the plurality of components 702 including measured values of the component parameter, a pick index, a pick order, and/or the like.

The dedicated hardware 712 may include a processor, a memory, a display, a power supply, a read-only memory, an input device, an input/output device, an analog-to-digital converter, a digital to analog converter, a clock, one or more sensors, a power source, and/or the like. The processor may be configured to process at least in part the component sequencing process 200, and/or the like.

The plurality of components 702 may be any type of component that may benefit from sequencing based on a component parameter, any type of electrical component that may benefit from sequencing based on a component parameter, and/or the like.

The plurality of components 702 may be any type of semiconductor device, transistor, power device, and/or power module. In this regard, the transistor types may include but are not limited to a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a metal insulator semiconductor FET (MISFET), a static induction transistor (SiT), a Thyristor, a Gate Turn-Off Thyristor (GTO), an Integrated Gate-Commutated Thyristor (IGCT), and/or the like. The term power device may refer to various forms of transistors and diodes designed for high voltages and currents. The transistors may be controllable switches allowing for unidirectional or bidirectional current flow (depending on device type) while the diodes may allow for current flow in one direction and may not controllable. The power module may implement a plurality of power devices that range in structure and purpose.

The plurality of components 702 may be any type of electrical component that may include resistors, capacitors, inductors, and/or the like.

The device implementation 708 may be a power module, a plurality of power modules, a transceiver, a plurality of transceivers, and/or the like. Additionally, the device implementation 708 may be any type of component. Accordingly, the implementation system 704 may operate to sequence the plurality of components 702 such that the device implementation 708 that may include a power module with the plurality of components 702 in the sequential order, a plurality of power modules with the plurality of components 702 in the sequential order, a transceiver with the plurality of components 702 in the sequential order, a plurality of transceivers with the plurality of components 702 in the sequential order, any type of component with the plurality of components 702 in the sequential order, and/or the like.

The shipping format 710 may be one or more of a waffle pack shipping format, a ring frame shipping format, a tape and reel shipping format, a one-dimensional array shipping format, a two-dimensional array shipping format, a three-dimensional array shipping format, a sheet shipping format, a wafer cassette shipping format, a wafer carrier box shipping format, a gel pack shipping format, stacks of any of the above, components in tube shipping format and/or the like. Accordingly, the implementation system 704 may operate to sequence the plurality of components 702 such that the shipping format 710 may include a waffle pack shipping format with the plurality of components 702 in the sequential order, a ring frame shipping format with the plurality of components 702 in the sequential order, a tape and reel shipping format with the plurality of components 702 in the sequential order, a one-dimensional array shipping format with the plurality of components 702 in the sequential order, a two-dimensional array shipping format with the plurality of components 702 in the sequential order, a three-dimensional array shipping format with the plurality of components 702 in the sequential order, a sheet shipping format with the plurality of components 702 in the sequential order, a wafer cassette shipping format with the plurality of components 702 in the sequential order, a wafer carrier box shipping format with the plurality of components 702 in the sequential order, a gel pack shipping format with the plurality of components 702 in the sequential order, components in tube shipping format with the plurality of components 702 in the sequential order, and/or the like. Thereafter, manufacturers may utilize the shipping format 710 of the plurality of components 702 that are sequentially ordered to manufacture the device implementation 708 by sequentially using the plurality of components 702 from the shipping format 710 to produce the device implementation 708.

In one or more aspects, the shipping format 710 may be one or more of a waffle pack shipping format, a ring frame shipping format, a tape and reel shipping format, a one-dimensional array shipping format, a two-dimensional array shipping format, a three-dimensional array shipping format, a sheet shipping format, a wafer cassette shipping format, a wafer carrier box shipping format, a gel pack shipping format, stacks of any of the above, components in tube shipping format, and/or the like.

In this regard, the shipping format 710 implementing a waffle pack shipping format may include the plurality of components 702 in the sequential order arranged in a tray. The tray may be plastic and may include pockets that match a size of the plurality of components 702. The shipping format 710 may be marked with the sequential order. The waffle pack may have a lid and may be delivered in an antistatic bag. The shipping format 710 may be configured to be entered into the pick and place machine for assembly of the device implementation 708.

The shipping format 710 implementing a tape and reel shipping format, a one-dimensional array shipping format, a two-dimensional array shipping format, a three-dimensional array shipping format, a sheet shipping format, a matrix tray, and/or the like may include the plurality of components 702 in the sequential order arranged on a substrate such as a tape, a membrane, a frame, and/or the like. The substrate may include an adhesive. The shipping format 710 may include a cover covering the plurality of components 702 in separate pockets in a long continuous strip that may be plastic. The shipping format 710 may be configured to be entered into the pick and place machine for assembly of the device implementation 708.

Accordingly, the methods and systems of the disclosure may ensure component parameters of the plurality of components 702 can be more accurately matched. For example, all of the plurality of components 702 in the shipping format 710 may be closely and accurately matched by a component sequencing; and/or all of the plurality of components 702 in the device implementation 708 may be closely and accurately matched by a component sequencing. For example, the components in multi-component devices, such as a power module, may be at or near the same electrical performance including, for example, temperature, equal sharing losses, and/or the like.

In this regard, multi-component devices, such as power modules and the like, may utilize multiple components in parallel to achieve higher performance such as higher current levels. To maximize the ampacity of the multi-component devices, such as power modules, all components in multi-component devices should beneficially behave in a similar fashion. The disclosed methods and systems utilize a sequencing process that ensures all components in multi-component devices generally behave in a similar fashion.

Figure 6:
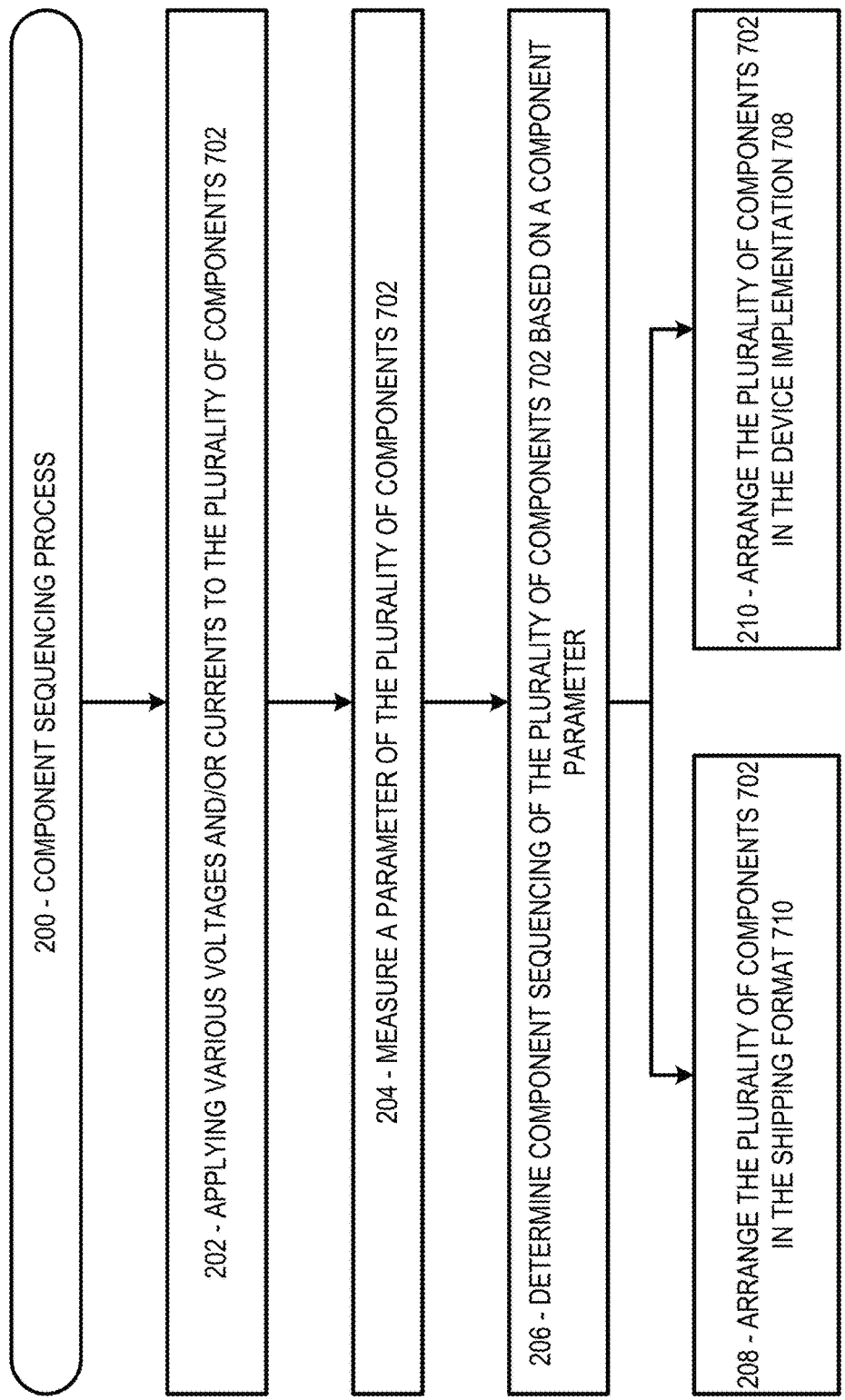
FIG. 6 illustrates a process of component sequencing according to the disclosure.

FIG. 6 illustrates a process of component sequencing according to the disclosure.

In particular, FIG. 6 illustrates a component sequencing process 200. The component sequencing process 200 may be implemented by one or more of the system 700, the testing device 706, the implementation system 704, the dedicated hardware 712, and/or the like The component sequencing process 200 may be applied to each of the plurality of components 702. Subsequently, the sequencing of the plurality of components 702 may be provided to the shipping format 710 and/or the device implementation 708. Moreover, the component sequencing process 200 may be utilized across multiple implementations of the device implementation 708 for systems implementing multiple implementations of the device implementation 708. In one aspect, the component sequencing process 200 may be applied to each of the plurality of components 702; and subsequently the component sequencing process 200 may be extended to a plurality of the device implementation 708 for systems implementing multiple implementations of the device implementation 708.

In this regard, the component sequencing process 200 may be applied to each of components for a multi-component device, such as a power module. Moreover, the component sequencing process 200 may be applied to each multi-component device, such as a power module, for multiple multi-component device implementations of multi-component devices and systems implementing the same. In one aspect, the component sequencing process 200 may be applied to each component; and subsequently the component sequencing process 200 may be applied to each multi-component utilizing a plurality of components for multiple multi-component implementations.

In this regard, the component sequencing process 200 may be implemented for each die for a multi-component device after manufacture of a die. Additionally, the component sequencing process 200 may be implemented for each multi-component device after manufacture of the multi-component device. Alternatively, the component sequencing process 200 may be implemented only for each die for a multi-component device after manufacture of a die. Alternatively, the component sequencing process 200 may be implemented only for each multi-component device after manufacture of the multi-component device.

The component sequencing process 200 may be implemented with the testing device 706 as described in further detail with respect to FIG. 14, the implementation system 704, and/or other components of the system 700. In this regard, the component sequencing process 200 in conjunction with the testing device 706 may operate by applying various voltages and/or currents to the plurality of components 702 (box 202).

More specifically, the testing device 706 may be electrically connected to the plurality of components 702, for example connected to one or more of a gate, a source, a drain, and/or the like of the plurality of components 702. Accordingly, the testing device 706 may operate the plurality of components 702 by applying various voltages and/or currents to the plurality of components 702 as illustrated in box 202. In this regard, the testing device 706 may include at least one power source having at least one controllable voltage and/or current output that may operate by applying various voltages and/or currents to the plurality of components 702 as illustrated in box 202.

The component sequencing process 200 may in conjunction with the testing device 706 may vary application of voltages and/or currents to the plurality of components 702. In one aspect, the component sequencing process 200 may in conjunction with the testing device 706 may sweep or vary application of a voltage to the plurality of components 702. In one aspect, the component sequencing process 200 may in conjunction with the testing device 706 may sweep or vary a voltage applied to the plurality of components 702.

In one or more aspects, the component sequencing process 200 may in conjunction with the testing device 706 may test the plurality of components 702 under switching conditions. In one or more aspects, the component sequencing process 200 may in conjunction with the testing device 706 may test the plurality of components 702 under switching conditions, where various voltages and/or currents are applied dynamically.

The component sequencing process 200 may in conjunction with the testing device 706 may measure a behavior of the plurality of components 702 (box 204). In this regard, the testing device 706 may include at least one sensor, such as a current sensor, a voltage sensor, and/or the like to measure and determine various characteristics of the plurality of components 702 including physical quantities such as device resistances (e.g., gate resistance), device capacitances, device resonant points, and/or the like. In one aspect, the component sequencing process 200 may in conjunction with the testing device 706 may measure various device currents and/or voltages of the plurality of components 702. In one aspect, the component sequencing process 200 may in conjunction with the testing device 706 may measure various currents and/or voltages of the plurality of components 702 with respect to time.

The component sequencing process 200 may in conjunction with the testing device 706 may determine component sequencing of the plurality of components 702 based on a component parameter (box 206). In one aspect, the component sequencing process 200 may determine a sequencing according to their electrical performance or a component parameter. The resulting sequence may be a 'highest to lowest' electrical performance or component parameter order. Likewise, a resulting sequence may be a lowest to highest electrical performance or component parameter. Additional component sequencing orders are disclosed herein as well. In particular, the component sequencing may include an Ascending-Descending Sequencing (ADS), a Half-Sine Sequencing (HSS), and/or a Full-Sine Sequencing (FSS).

In particular, the component sequencing process 200 may in conjunction with the testing device 706 may determine a component sequencing of the plurality of components 702 based on a component parameter (box 206) and may generate a component performance-based mapping, a component performance-based wafer probe map, a component performance-based listing, and/or the like. Thereafter, the component performance-based mapping, the component performance-based wafer probe map, the component performance-based listing, and/or the like may be sorted by the component parameter to generate a sequential list of the plurality of components based on the component parameter. Thereafter, a pick index, a pick order, and/or the like may be generated and appended to the component data. Finally, the plurality of components may be placed in sequential order based on the component parameter.

The component sequencing process 200 may in conjunction with the testing device 706 may determine component sequencing of the plurality of components 702 based on a first component parameter and a second component parameter. The component sequencing process 200 may in conjunction with the system 700, the implementation system 704, the dedicated hardware 712, the testing device 706 and/or the like may determine component sequencing of the plurality of components 702 based on a plurality of component parameters. In this regard, the component sequencing process 200 may in conjunction with the system 700, the implementation system 704, the dedicated hardware 712, the testing device 706, and/or the like may determine sequencing of the plurality of components 702 based on one or more component parameters.

In one aspect, the component sequencing process 200 may in conjunction with the system 700, the implementation system 704, the dedicated hardware 712, the testing device 706, and/or the like may determine component sequencing, such as die sequencing, of the plurality of components 702 based on a plurality of component parameters that are each weighted with various values. In one aspect, one or more of the weighted values may be different. In one aspect, one or more of the weighted values may be the same.

In one aspect, the component sequencing process 200 possibly in conjunction with the system 700, the implementation system 704, the dedicated hardware 712, the testing device 706, and/or the like may determine component sequencing, such as die sequencing, of the plurality of components 702 and may output various component sequencing criteria to an output device such as a display, a printer, and/or the like. In one aspect, the component sequencing process 200 may in conjunction with the testing device 706 determine component sequencing of the device and may store various component sequencing criteria to a memory, the database 714, and/or the like.

The component sequencing process 200 may alternatively and/or further utilize artificial intelligence and/or machine learning to compare, characterize and/or the like and perform the sequencing. The artificial intelligence and/or machine learning may utilize any number of approaches including one or more of cybernetics and brain simulation, symbolic, cognitive simulation, logic-based, anti-logic, knowledge-based, sub-symbolic, embodied intelligence, computational intelligence and soft computing, machine learning and statistics, and/or the like.

The component sequencing process 200 may utilize the sequencing in order to arrange the plurality of components 702 in the shipping format 710 (box 208). Accordingly, the implementation system 704 may operate in response to the component sequencing process 200 to sequence the plurality of components 702. In particular, the shipping format 710 may include a waffle pack shipping format with the plurality of components 702 in the sequential order, a ring frame shipping format with the plurality of components 702 in the sequential order, a tape and reel shipping format with the plurality of components 702 in the sequential order, a one-dimensional array shipping format with the plurality of components 702 in the sequential order, a two-dimensional array shipping format with the plurality of components 702 in the sequential order, a three-dimensional array shipping format with the plurality of components 702 in the sequential order, a sheet shipping format with the plurality of components 702 in the sequential order, and/or the like. Thereafter, manufacturers may utilize the shipping format 710 of the plurality of components 702 that are sequentially ordered to manufacture the device implementation 708 by sequentially using the plurality of components 702 from the shipping format 710 to produce the device implementation 708.

The component sequencing process 200 may alternatively utilize the sequencing in order to arrange the plurality of components 702 in the device implementation 708 (box 210). Accordingly, the implementation system 704 may operate in response to the component sequencing process 200 to sequence the plurality of components 702 such that the device implementation 708 that may include a power module with the plurality of components 702 in the sequential order, a plurality of power modules with the plurality of components 702 in the sequential order, a transceiver with the plurality of components 702 in the sequential order, a plurality of transceivers with the plurality of components 702 in the sequential order, any type of component with the plurality of components 702 in the sequential order, and/or the like.

Figure 7:
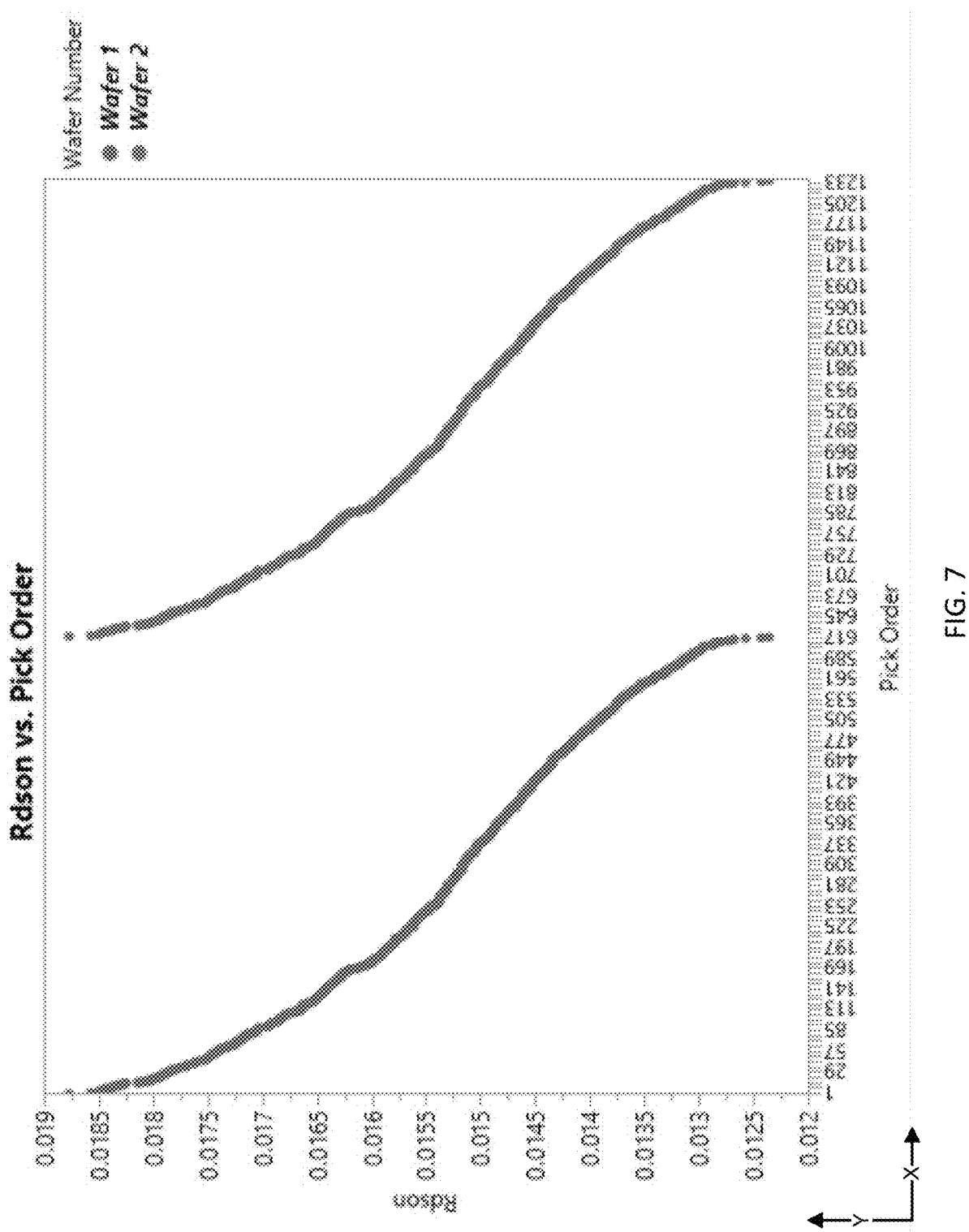
FIG. 7 illustrates a plot of sequenced die pick order versus Rds(on) for two wafers based on simulated data.

FIG. 7 illustrates a plot of sequenced die pick order versus Rds(on) for two wafers based on simulated data.

Figure 8:
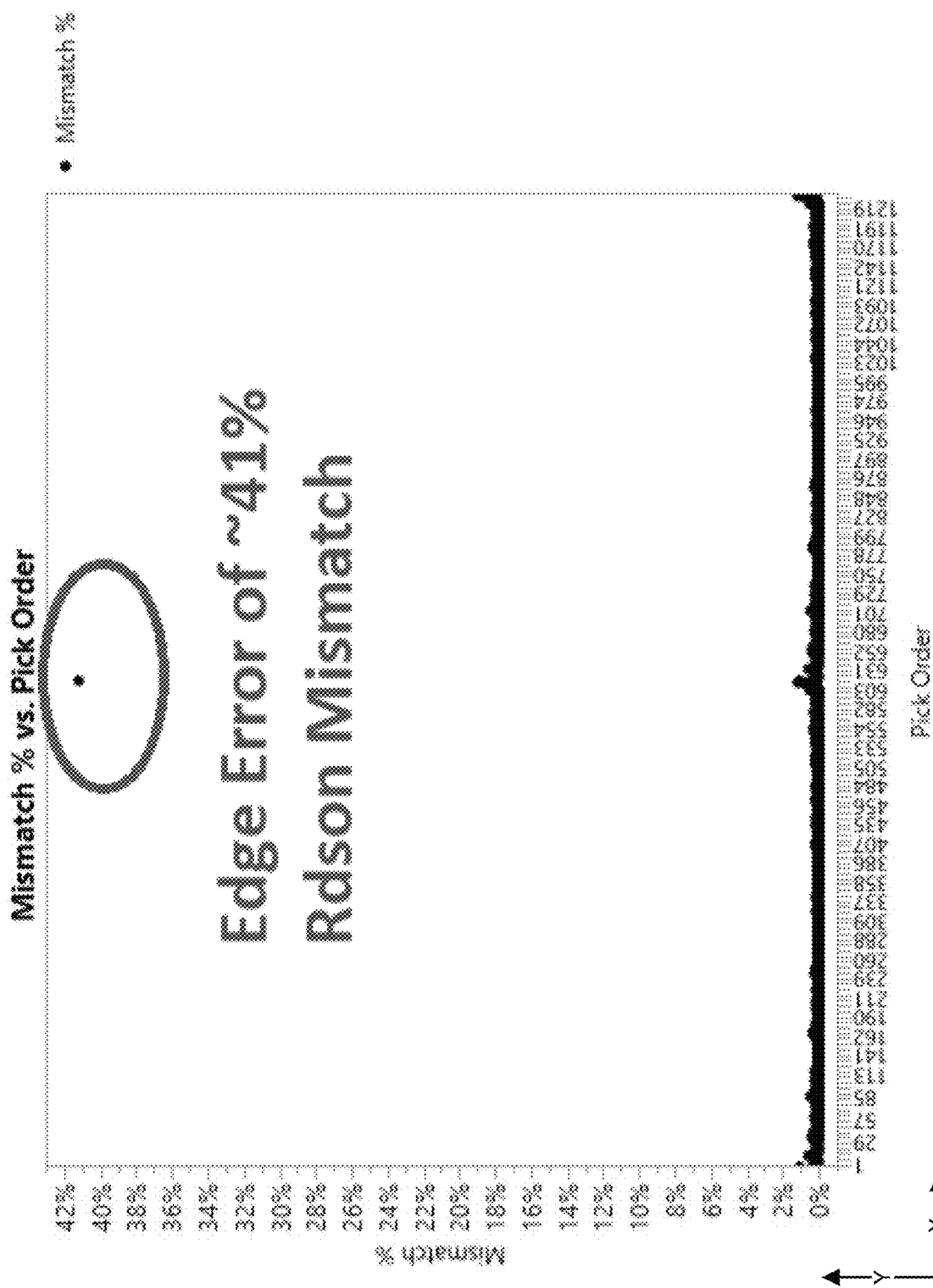
FIG. 8 illustrates a percentage of mismatch versus pick order for sequenced die pick order versus Rds(on) for the two wafers of FIG. 7.

FIG. 8 illustrates a percentage of mismatch versus pick order for sequenced die pick order versus Rds(on) for the two wafers of FIG. 7.

In particular, the disclosed methods and systems further relate to improved component sequencing or die sequencing that solves possible additional issues that may be referred to as an 'Edge Error.' In this regard, the edge error may be a spike in component mismatch or die-to-die mismatch when moving from one source, such as a wafer, to another source in an assembly process. The disclosed component sequencing method reduces component to component mismatch or die-to-die mismatch to its lowest theoretical possible level for a single wafer. However, it sometimes may be desired to apply die mismatch controls to a larger source population, such as a whole wafer lot at a time. If the standard die sequencing method is used at the lot-level, there can be very large mismatches between the last die of a wafer that has been sequenced and the first die of the next wafer that has been sequenced. The disclosure further provides a number of ways this can be avoided. In particular, the additional sequencing processes may be referred to as: 'Ascending-Descending Sequencing' (ADS), 'Half-Sine Sequencing' (HSS), and 'Full-Sine Sequencing' (FSS). These methods range from simplest to most complex but with added complexity may come enhanced operational reliability.

The edge error in component sequencing can be demonstrated by analyzing an example set of synthetic data or simulated data that includes two identical wafer probe data sets. In this regard, the following provides particular reference to a source of the components that is a wafer. However, the source of components can be from any source. Additionally, the following provides reference to a component that is a die. However, the components can be any type of component as described herein.

FIG. 7 shows a plot of sequenced die pick order versus Rds(on) for two wafers. In particular, FIG. 7 illustrates a graph of data for a sequenced numerical pick order along the x-axis vs an on-state resistance (Rds(on)) in ohms along the y-axis. If these sequenced die were loaded into a continuous assembly line, as are used in multi-chip module assembly, then the die would be consumed according to the Pick Order (X-axis). When die to die mismatch as a function of Pick Order is calculated, shown in FIG. 8, the extreme Edge Error (die mismatch) can be observed. In this regard, the y-axis shows the percent of mismatch and the x-axis shows pick order. As shown in FIG. 8, the edge error results in an approximate mismatch percentage of 41%.

Figure 9:
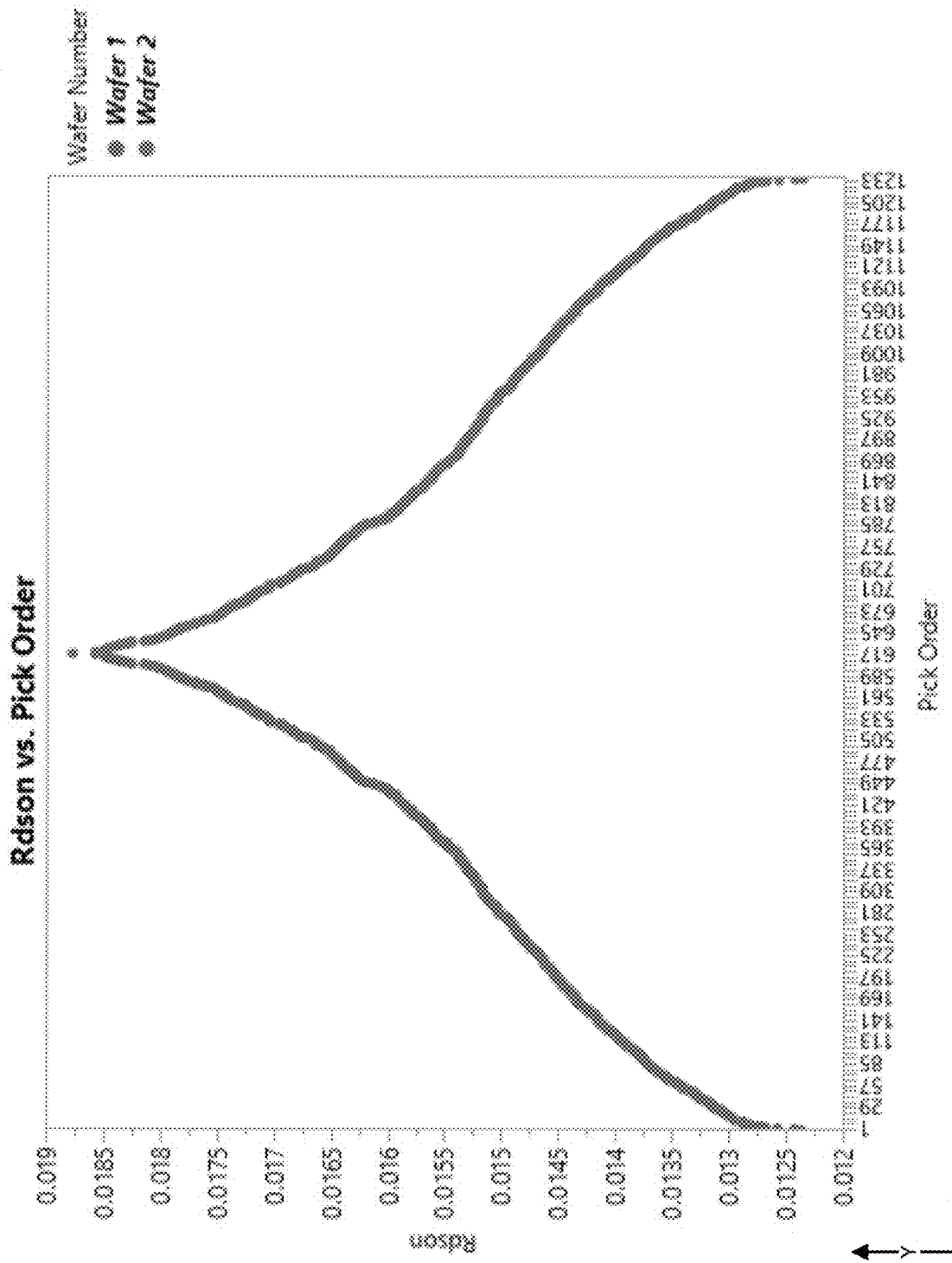
FIG. 9 illustrates two wafers with Rds(on) vs Pick Order with Ascending-Descending Sequencing (ADS) applied according to the disclosure based on simulated data.

FIG. 9 illustrates two wafers with Rds(on) vs Pick Order with Ascending-Descending Sequencing (ADS) applied according to the disclosure based on simulated data.

The simplest solution to the Edge Error problem is to use the so called 'Ascending-Descending Sequencing' (ADS) approach. This method entails alternating the sorting order of every other component source, for example a wafer, used in a production sequence. The first wafer would be sequenced low to high, the next would be sequenced high to low, and so on, alternating from ascending to descending. FIG. 9 shows two wafers with Rds(on) vs Pick Order with ADS applied. In particular, FIG. 9 illustrates data for a sequenced numerical pick order with ADS applied along the x-axis vs an on-state resistance (Rds(on)) in ohms along the y-axis utilizing the disclosed methods and systems according to the disclosure.

Figure 10:
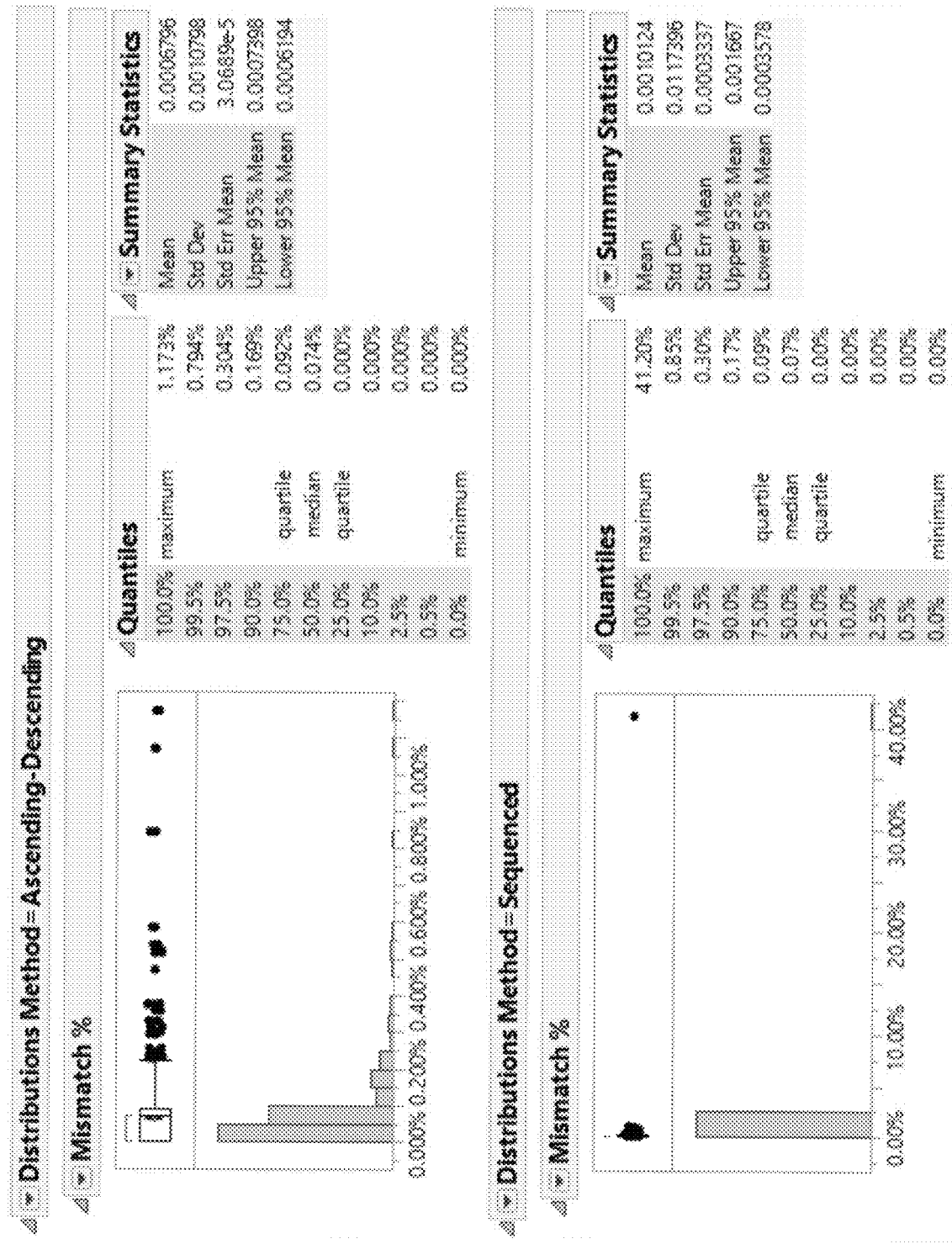
FIG. 10 shows the distribution of die-to-die Mismatch for the ADS method and the die sequencing method respectively based on simulated data.

FIG. 10 shows the distribution of die-to-die Mismatch for the ADS method and the die sequencing method respectively based on simulated data.

In particular, the upper chart illustrates mismatch percentage data for the ADS method of FIG. 9 and the lower chart illustrates mismatch percentage for the sequencing data of FIG. 7. In this regard, the upper chart illustrates a maximum mismatch percentage of 1.173% for the ADS method of FIG. 9. The additional data of the upper chart additionally shows the numerous benefits of the ADS method. On the other hand, the lower chart illustrates a maximum mismatch percentage 41.20% for the sequencing data of FIG. 7. It can be clearly seen from the distributions in FIG. 10 that the ADS method may reduce an impact of the Edge Error in this example by making the end of one wafer match with the start of the next. In this regard, the system 700 may operate to sequence the plurality of components 702 such that the sequence implemented by the component sequencing process 200 includes an Ascending-Descending Sequencing' (ADS) approach.

This method is the simplest to implement but may have some weaknesses. For example, if the plurality of components 702 are dies manufactured on wafers and if the wafers got out of order, it could be possible at an assembly line to have an 'ascending' wafer follow another 'ascending' wafer. If the wafers got out of order due to an off-nominal action by an operator or a tool, the Edge Error that was trying to be avoided may be able to occur. Therefore, the Ascending-Descending approach has a fault mode that could unintentionally introduce a near maximally large die to die mismatch. The method could safely and robustly be used if the die were delivered to the assembly site in a tape and reel format, which can contain multiple wafers worth of die. The up-down-up-down rhythm could be maintained in a tape and reel loading with high confidence. The chance for Edge Error may be increased if the shipping format is a waffle pack or ring frame, for instance, as this type of shipping format can only hold a fraction of a wafer and so the order of waffle packs or frames should be closely controlled.

Figure 11:
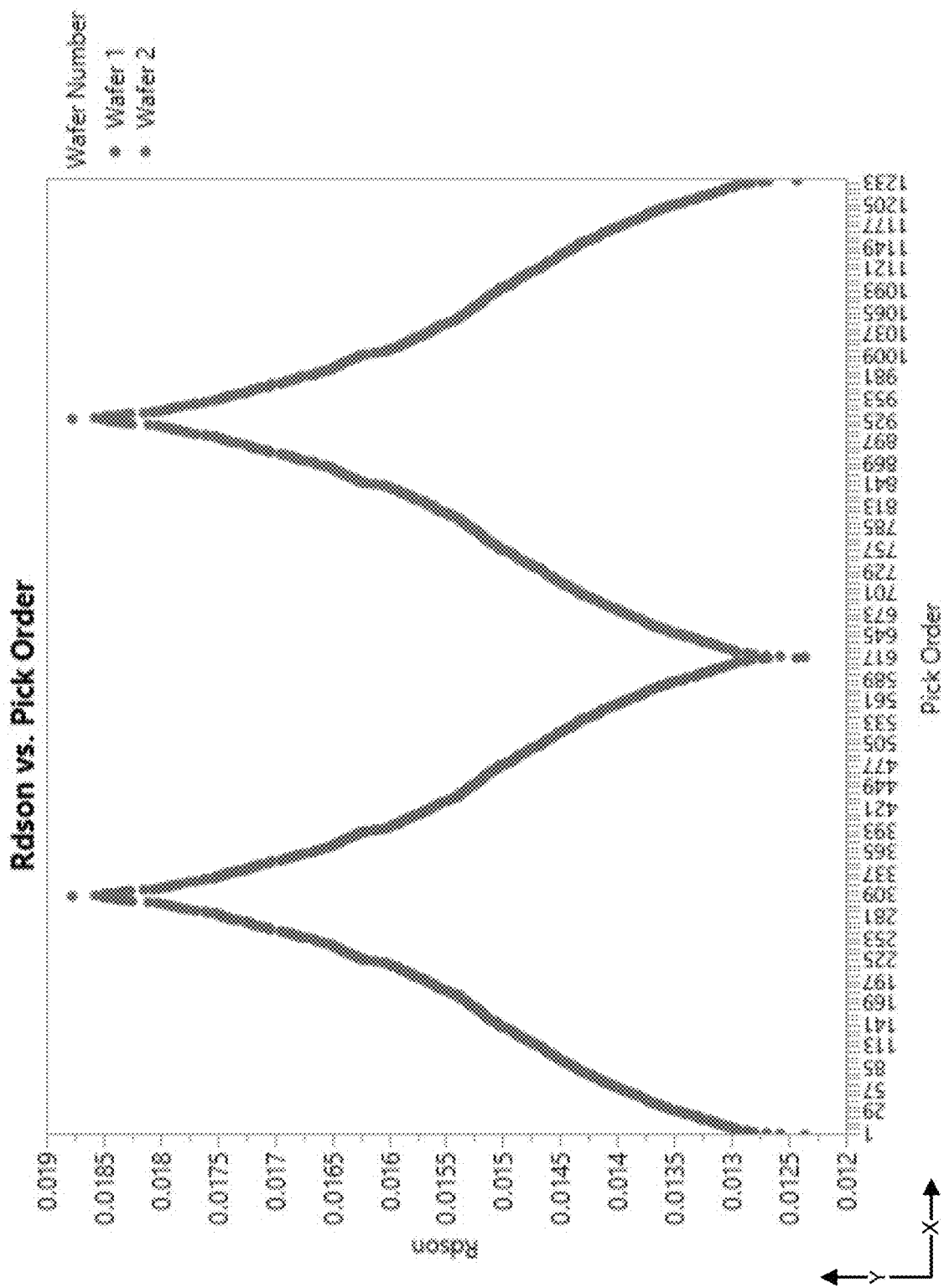
FIG. 11 illustrates two wafers with Rds(on) vs Pick Order with Half-Sine Sequence (HSS) applied according to the disclosure based on simulated data.

FIG. 11 illustrates two wafers with Rds(on) vs Pick Order with Half-Sine Sequence (HSS) applied according to the disclosure based on simulated data.

The second improvement on Die Sequencing is the Half-Sine Sequence (HSS). This approach is designed so that every shipping format, which may contain at least a whole wafer, has die that start AND end with low values of the key matching parameter (or alternatively with high values of the key matching parameter). This may be done by dividing a wafer's die population of the plurality of components 702 into two halves that may have near identical distributions of the component parameter and then sorting one half of the plurality of components 702 in an ascending manner and the other half of the plurality of components 702 in a descending manner. One example of how this may be handled mathematically is by sequencing the plurality of components 702 as before using standard die sequencing according to the disclosure by the system 700 in conjunction with the component sequencing process 200 and assigning intermediate indexed ones of the plurality of components 702 from 1 to N (N is the number of known good die on wafer). The population of the plurality of components 702 may be split into two by segregating by an even or odd index value with the system 700 and/or the component sequencing process 200. The odd index value of the plurality of components 702 may be sorted in an ascending order and the even index value of the plurality of components 702 may be sorted in a descending order by the system 700 and/or the component sequencing process 200. After each group is sorted, the plurality of components 702 may then be re-merged starting with the odd group first and then the even group by the system 700 and/or the component sequencing process 200. The disclosure further contemplates other related sorting algorithms which may produce an identical or nearly identical ordering of the devices in a Half-Sine Sequence. For example, a pick order may be assigned by picking and populating alternately from either end of the distribution into opposite "ends" by the system 700 and/or the component sequencing process 200.

The application of the HSS method may ensure that Edge Error is reduced when transitioning from wafer to wafer. Application of the HSS method also may not require sequential shipments of the plurality of components 702 to follow any particular order without risking large Edge Error like in the ADS method.

Figure 12:
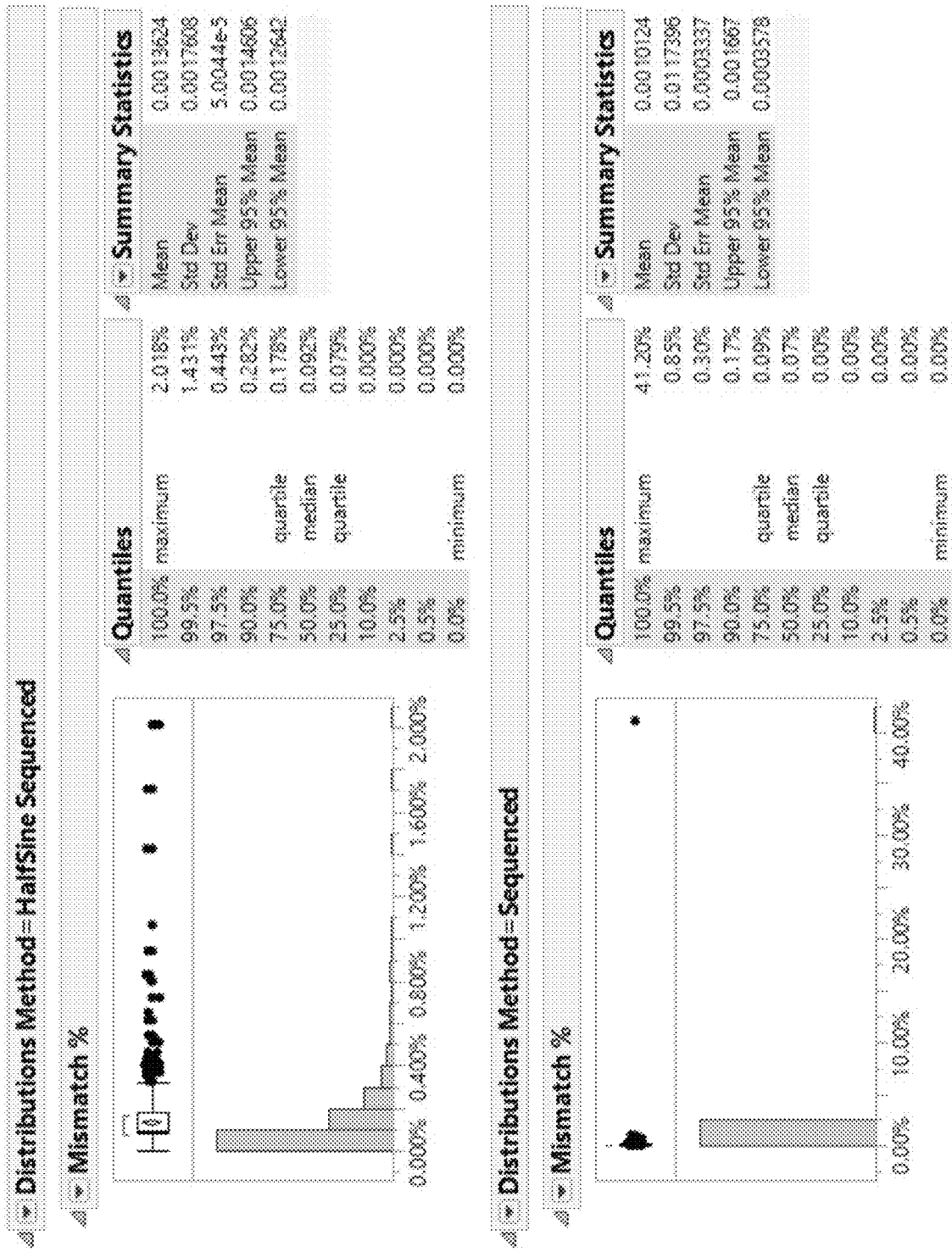
FIG. 12 shows the distribution of die-to-die Mismatch for the HSS method and the die sequencing method respectively based on simulated data.

FIG. 12 shows the distribution of die-to-die Mismatch for the HSS method and the die sequencing method respectively based on simulated data.

In particular, the upper chart illustrates mismatch percentage data for the HSS method of FIG. 11 and the lower chart illustrates mismatch percentage for the sequencing data of FIG. 7. In this regard, the upper chart illustrates a maximum mismatch percentage of 2.018% for the HSS method of FIG. 11. The additional data of the upper chart additionally shows the numerous benefits of the HSS method. On the other hand, the lower chart illustrates a maximum mismatch percentage 41.20% for the sequencing data of FIG. 7.

Figure 13:
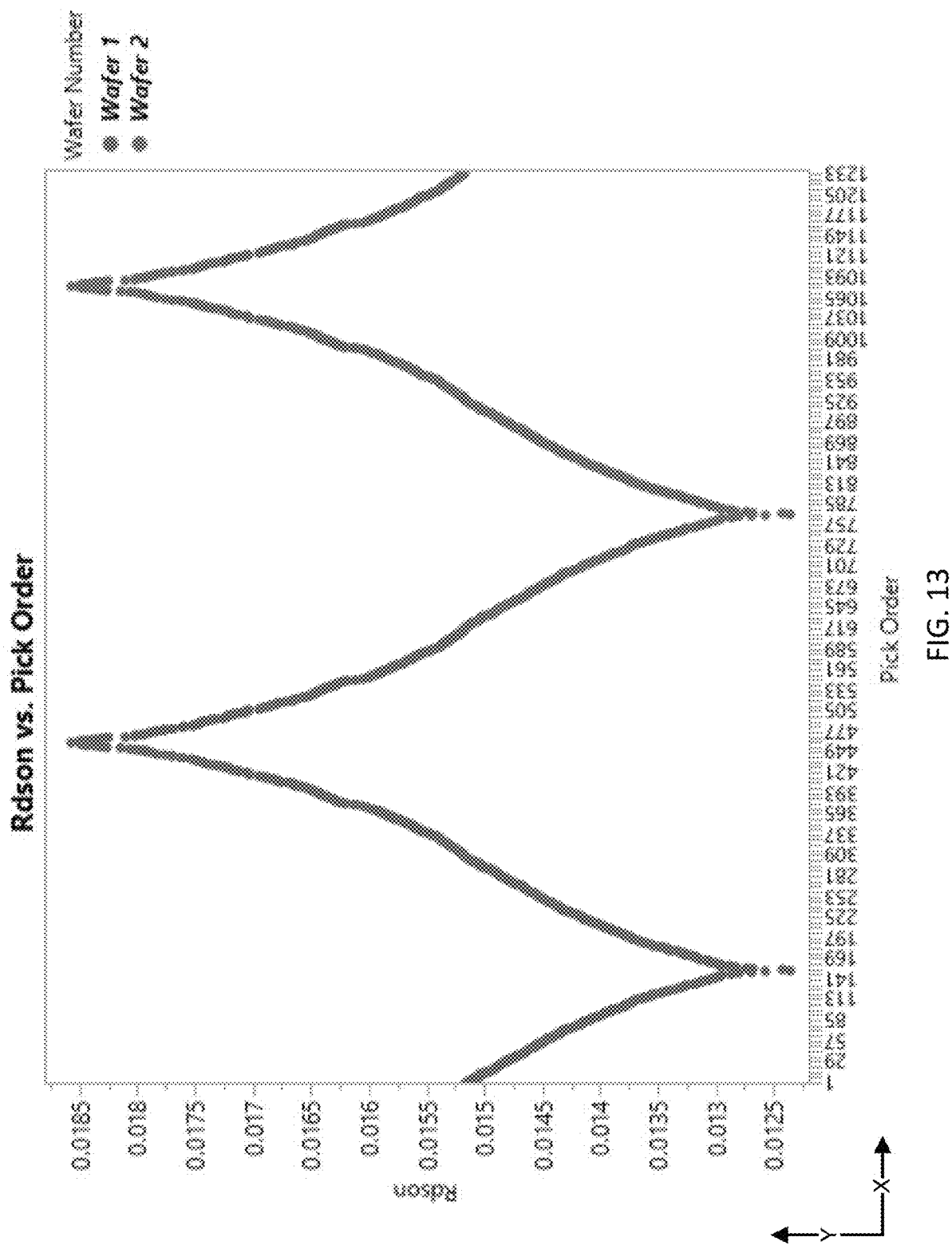
FIG. 13 illustrates two wafers with Rds(on) vs Pick Order with Full-Sine Sequencing (FSS) applied according to the disclosure based on simulated data.

FIG. 13 illustrates two wafers with Rds(on) vs Pick Order with Full-Sine Sequencing (FSS) applied according to the disclosure based on simulated data.

In particular, FIG. 13 illustrates a third improvement on die sequencing utilizing the Full-Sine Sequencing (FSS) method. The FSS method may be designed to retain the value of the ADS method and the HSS method and have an additional feature. The FSS method may ensure that each wafer of the plurality of components 702 starts and ends with parts with a median matching component parameter values. While the HSS method may ensure that each wafer starts with the minimum (or could be maximum) matching component parameter values, leading to wafer to wafer component matching, there may be reasons why it is undesirable to always start with the minimum (or maximum) value of the component parameter of the plurality of components 702. The values of a component parameter, such as Rds(on), or any other matching parameter, on a wafer commonly have a normal distribution. Due to the properties of a normal distribution, the minimum (or maximum) values of the component parameter of the plurality of components 702 typically may have the largest die-to-die mismatch at the wafer level. Put another way, there may be a larger distance (in mOhm, V, mA, etc.) between individuals within the plurality of components 702 at the tails of a normal distribution than there is at the center of the distribution. Furthermore, the minimum (or maximum) values of the component parameter of the plurality of components 702 may differ from wafer to wafer much more than the median value of the component parameter of the plurality of components 702. Therefore, the mismatch of a component parameter of the plurality of components 702 between the minimum (or maximum) component parameter value of the plurality of components 702 on one wafer and the minimum (or maximum) value of the component parameter of the plurality of components 702 on the next wafer may be greater on average than the mismatch between medians of a component parameter of the plurality of components 702 of different wafers. Therefore, if there are any significant shifts in the tails of the distribution of matching component parameters of the plurality of components 702 between wafers it may accordingly be better to use the FSS method over the HSS method.

FIG. 13 illustrates how the distribution looks after the FSS method has been applied. The FSS method may include creating four quadrants of component parameter of the plurality of components 702 through a series of sorting steps with the system 700 and/or the component sequencing process 200. The first quadrant may be half of the lower 50th percentile of the plurality of components 702 sorted in a descending order of the component parameter. The second quadrant may be the second half of the lower 50th percentile of the plurality of components 702 sorted in an ascending order of the component parameter. The third quadrant may be half of the upper 50th percentile of the plurality of components 702 sorted in an ascending order of the component parameter. The fourth quadrant may be the second half of the upper 50th percentile of the plurality of components 702 sorted in a descending order of the component parameter. Both the upper and lower 50th percentiles may be separated in the same manner that was used for the HSS method.

An example process of applying the FSS method may be as follows. First, create two subsets of a wafer's population of the plurality of components 702: the upper and lower 50th percentiles of the plurality of components 702 based on component parameter, such as Rds(on). Next, each of the two subsets of the plurality of components 702 then have the HSS method applied to them with the system 700 and/or the component sequencing process 200 where the first subset uses ascending first and the second uses descending first (or first descending, then ascending). The disclosure further contemplates other related sorting algorithms which may produce an identical or nearly identical ordering of the devices with the FSS method.

Aspects of the disclosed methods and systems may include a software tool that modifies instructions for die handling tools such as the system 700, the testing device 706, the implementation system 704, and/or the dedicated hardware 712. Aspects of the disclosed methods and systems may either modify the order in which the plurality of components 702 are picked from a wafer, an intermediate shipping format, or a pattern (location) they are deposited into the shipping format 710. Aspects of the disclosed methods and systems may implement the ADS profile on a lot of wafers as they are loaded the shipping format 710. Aspects of the disclosed methods and systems may implement the HSS method on an entire wafer as it is loaded into the shipping format 710. Aspects of the disclosed methods and systems may implement FSS method on a subset of the plurality of components 702 of a wafer as it is loaded into a waffle pack or other type of the shipping format 710. Aspects of the disclosed methods and systems may provide superior technical performance of a customer's proposed solutions while reducing operational complexity and logistical overhead.

FIG. 14 illustrates a testing device utilized at least in part for the process according to the disclosure.

In particular, FIG. 14 illustrates the testing device 706 for use with various aspects of the disclosure. The testing device 706 may be implemented as a mechanical probe station, a curve tracer implemented with curve tracer functionality, and the like. The testing device 706 may be used to physically acquire signals from the plurality of components 702. For example, the testing device 706 may be implemented with curve tracer functionality that may be programmed to take a limited number of total data points to ensure stability of the results.

The testing device 706 may utilize connectors, manipulators, and/or the like, which may allow a connection to the plurality of components 702. In one aspect, the connectors and/or manipulators may include the connectors implemented as needles that may be positioned in relation to the plurality of components 702 for capturing voltages and/or currents, to a gate, a source, and/or a drain. Moreover, the connectors and/or manipulators that may include the connectors may be positioned in relation to the plurality of components 702 for applying voltages and/or currents to the gate, the source, and/or the drain of the plurality of components 702.

The testing device 706 may include a processor 352, a memory 356, a display 368, a power supply 354, a read-only memory 372, an input device 364, an input/output device 362, an analog-to-digital converter 360, a digital to analog converter 370, a clock 358, one or more sensors 392, a power source 394, and/or the like. The processor 352 may be configured to process at least in part test functions, provide other test services, implement the component sequencing process 200, and/or the like. In one aspect, the testing device 706 may be implemented as a source measure unit (SMU), which may be capable of both sourcing input to the plurality of components 702 and measuring output from the plurality of components 702.

The power source 394 may be configured as a highly stable DC power source, a constant current source, a constant voltage source, a variable current source, a variable voltage source, and/or the like. In one aspect, the testing device 706 in conjunction with the power source 394 may include sweep capabilities. The sweep capabilities may be configured to test the plurality of components 702 under a range of conditions with different sources, different voltages, different currents, different time periods, different delays, and/or the like. The sweep capabilities may include fixed level current sweeps, fixed level voltage sweeps, linear sweeps, logarithmic sweeps, pulsed sweeps, and/or the like. The one or more sensors 392 may measure various component parameters. Moreover, the one or more sensors 392 may measure various component parameters during a sweeping function.

The testing device 706 may implement instrument integration, communication, test protocols, test time, and/or the like by utilizing an on-board script processor. The testing device 706 may allow user-defined on-board script execution for controlling test sequencing, test flow, decision making, instrument autonomy, implementation of the component sequencing process 200, and/or the like. The testing device 706 may include contact check functionality to verify good connections to the plurality of components 702 under test before the test begins.

Additionally, the testing device 706 may implement an operating system, a touchscreen controller, a communications component, a graphics component, a contact/motion component, and/or the like to provide full functionality. In particular, the processor 352 may be configured to execute a software application configured to control the testing device 706 such as the component sequencing process 200 as described herein.

In one aspect, the software application may be configured to interact with the one or more sensors 392 and/or the like as described herein. In particular, the one or more sensors 392 may provide signals to the processor 352. The one or more sensors 392 may include one or more current sensors, one or more voltage sensors, and/or the like.

The testing device 706 may implement a testing protocol that may include the component sequencing process 200. The testing protocol may determine particular voltage levels, current amounts, time periods, and/or the like for the delivery to the plurality of components 702. The testing device 706 may be configured to utilize outputs from the one or more sensors 392 to adjust the current, voltage, and/or the like provided by power source 394 in conjunction with the component sequencing process 200.

The testing device 706 may determine component sequencing criteria of the plurality of components 702 and may output various component sequencing criteria to an output device such as a display, a printer, and/or the like. In one aspect, the testing device 706 may determine component sequencing of the plurality of components 702 and may store various component sequencing criteria to a memory, a database, and/or the like. Finally, the various component sequencing criteria may be utilized in manufacturing and/or configuring multiple die devices, multiple multi-die devices, and/or the like with the plurality of components 702.

The disclosed methods and systems may be utilized for any type of semiconductor device, transistor, power device, and/or power module. In this regard, the transistor types may include but are not limited to a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a metal insulator semiconductor FET (MISFET), and/or the like. The term power device may refer to various forms of transistors and diodes designed for high voltages and currents. The transistors may be controllable switches allowing for unidirectional or bidirectional current flow (depending on device type) while the diodes may allow for current flow in one direction and may not controllable. The power module may implement a plurality of power devices that range in structure and purpose.

The disclosed methods and systems may be utilized for sorting and using sorted parts that can be applied to any collection of components which can be arranged according to a shared property and/or shared properties. In this regard, to the degree that ordering provides a benefit to the properties of any defined sub-grouping of the components, the disclosed methods and systems provide a beneficial utility. For example, measuring, ranking, and sorting a width of power terminals used in a power module design within each shipment to reduce a variation of parts used within a module. In this regard, the disclosed methods and systems may increase a precision of fit a customer would experience when implementing the power module, such as bolting busbars to the power module as it is integrated into a larger system.

As another example, for an optical system the components may be lenses, mirrors, and/or the like that may benefit from matching in regard to, for example, refractive index for telescopes/microscopes, for terminations of fiber optic transmission lines, the ground angles on mirrors/lenses within a telescope containing an array of individual mirrors so that the variation of nearest-neighbors is minimized, and/or the like. As another example, the plurality of components may include light emitting diodes and the component properties may be various properties of the light emitting diodes.

Moreover, the disclosed system and process as described herein describes to some degree a one-dimensional sequencing order. However, the disclosure further contemplates a multi-dimensional sequencing order for components where an array of components may be sequenced such that adjacent or neighbor components may be likewise sequenced multi-dimensionally. In particular, a sequence of components may account for X axis sequencing, Y axis sequencing, and perhaps a second order or more. In particular, the disclosure contemplates matching not just a single dimensional array, but may also sequence a multidimensional arrangement of components such that neighbor components have a higher level of matching.

The disclosed methods and systems may be utilized for a power module that may include structure optimized for state-of-the-art wide band gap power semiconductor devices fabricated from wide bandgap materials such as Gallium Nitride (GaN), Silicon Carbide (SiC), and/or the like, which are capable of carrying high amounts of currents and voltages and switching at increasingly faster speeds in comparison with established technologies. For example, a power module that may include structure optimized for state-of-the-art wide band gap power semiconductor devices such as Silicon Carbide (SiC) MOSFETs, Silicon Carbide (SiC) JFETs, Silicon Carbide (SiC) IGBTs, Silicon Carbide (SiC) Schottky Diodes, Gallium Nitride (GaN) HEMTs, PiN Diodes, metal insulator semiconductor FET (MISFETs), and/or the like. The power devices may include Wide Band Gap (WBG) semiconductors, including Wide Band Gap (WBG) semiconductors fabricated from Gallium Nitride (GaN), Silicon Carbide (SiC), and/or the like, and offer numerous advantages over conventional Silicon (Si) as a material for the power devices. Nevertheless, various aspects of the disclosure may utilize Si type power devices and achieve a number of the benefits described herein.

In one aspect, the disclosed methods and systems may be utilized for configuration of a power module such that the power module may evenly distribute current between large arrays of paralleled devices. The disclosed methods and systems may be utilized for configuration of a power module such that the power module may achieve significant improvements to the internal module performance. The disclosed methods and systems may be utilized for configuration of a power module to allow for full utilization of the capabilities of advanced power semiconductors, providing significant improvements to power density, switching, efficiency, and/or the like.

In one aspect, the disclosed methods and systems may be utilized for configuration of a plurality power modules such that the plurality power modules may evenly distribute current between large arrays of paralleled devices. The disclosed methods and systems may be utilized for configuration of a plurality power modules such that the plurality power modules may achieve significant improvements to the internal module performance. The disclosed methods and systems may be utilized for configuration of a plurality power modules to allow for full utilization of the capabilities of advanced power semiconductors, providing significant improvements to power density, switching, efficiency, and/or the like.

Figure 15B:
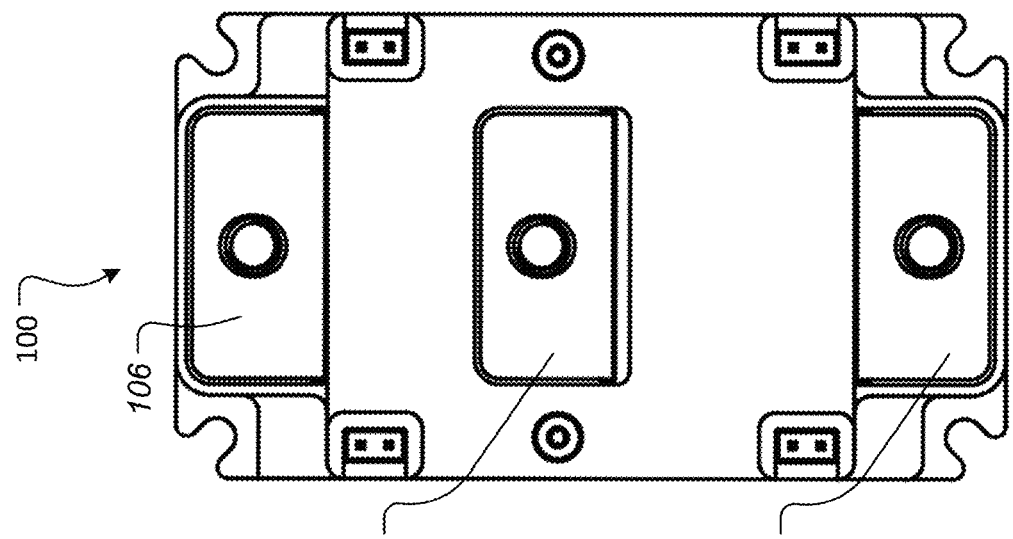
FIG. 15B illustrates a top schematic view of a power module constructed according to an aspect of the disclosure.
Figure 15A:
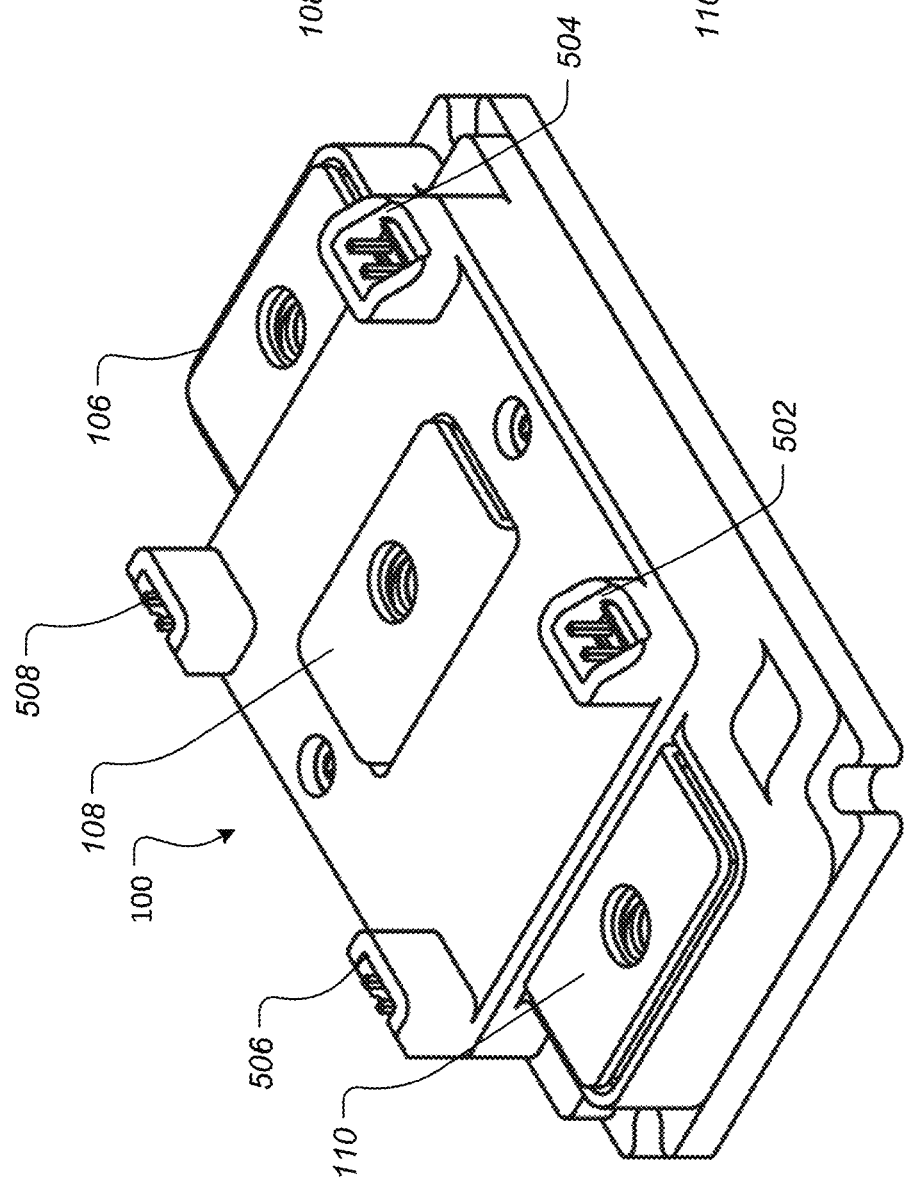
FIG. 15A illustrates a perspective schematic view of a power module constructed according to an aspect of the disclosure.
Figure 16:
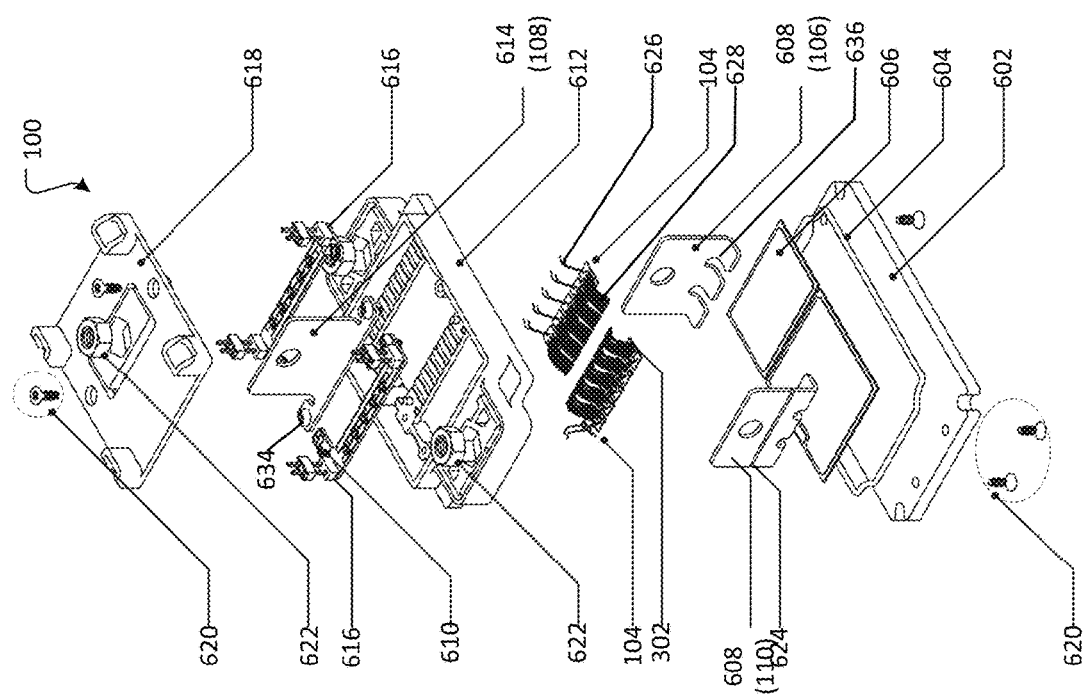
FIG. 16 illustrates an exploded view of the power module according to aspects of the disclosure.
Figure 17:
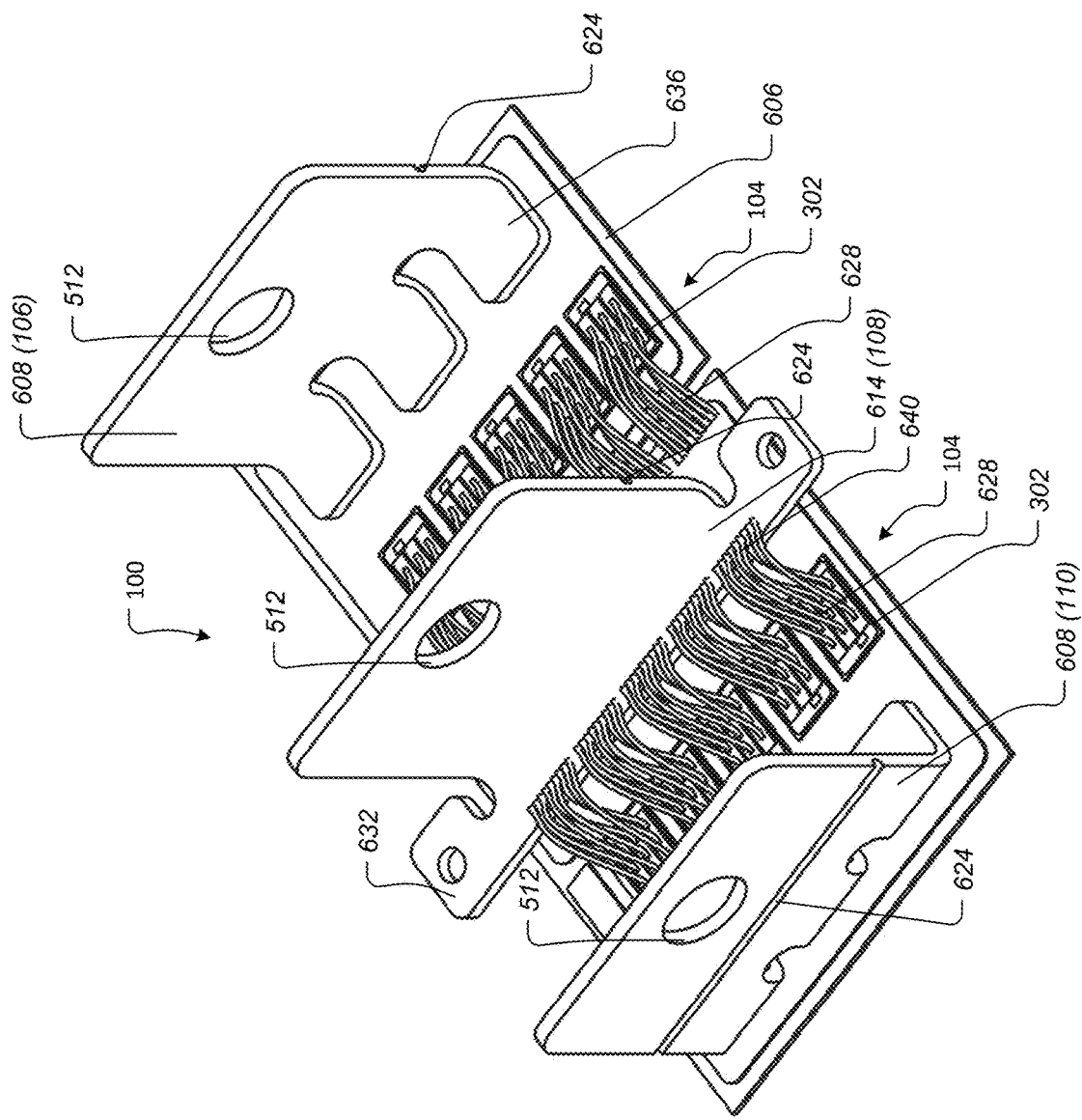
FIG. 17 illustrates a partial view of the power module of FIG. 16.

FIG. 15A illustrates a perspective schematic view of a power module constructed according to an aspect of the disclosure; FIG. 15B illustrates a top schematic view of a power module constructed according to an aspect of the disclosure; FIG. 16 illustrates an exploded view of the power module according to aspects of the disclosure; and FIG. 17 illustrates a partial view of the power module of FIG. 16.

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

In particular, a half-bridge configuration of the power module 100 is illustrated in FIG. 15A and FIG. 15B; and FIG. 16 illustrates a number of elements in a power module 100. The power module 100 may include one or more switch positions 104. The one or more switch positions 104 may include power devices 302 that may include any combination of controllable switches and diodes placed in parallel to meet requirements for current, voltage, and efficiency.

In particular, the power devices 302 may be selected and implemented consistent with the disclosed methods and systems of the disclosure. More specifically, the power devices 302 may be subjected to the component sequencing process 200 and/or the system 700 as described herein.

In this regard, the component sequencing process 200 may be applied to each of the power devices 302 for the power module 100. Moreover, the component sequencing process 200 may be applied to each power module 100 utilized in a multiple power module implementation.

Accordingly, the power devices 302 implemented by the power module 100 may be configured to ensure maximum sharing of losses between the power devices 302. Moreover, the power module 100 may be selected based on component sequencing to ensure maximum sharing of losses between multiple implementations of the power module 100.

Accordingly, the power module 100 and the power devices 302 may minimize derating and/or may maximize reliability by ensuring loss may be distributed more equally among parallel devices reducing a tendency for thermal mismatch, runaway, and/or the like. The disclosed power module 100 and the power devices 302 may be utilized to deliver customer-matched components, which can be used to realize scalable architectures operating in parallel.

More specifically, the power module 100 and the power devices 302 may ensure key loss mechanisms are more accurately matched such that each power module 100 and each of the power devices 302 may be at or near the same temperature, share losses equally, evenly distribute current, consistently perform, and/or the like.

Figure 18:
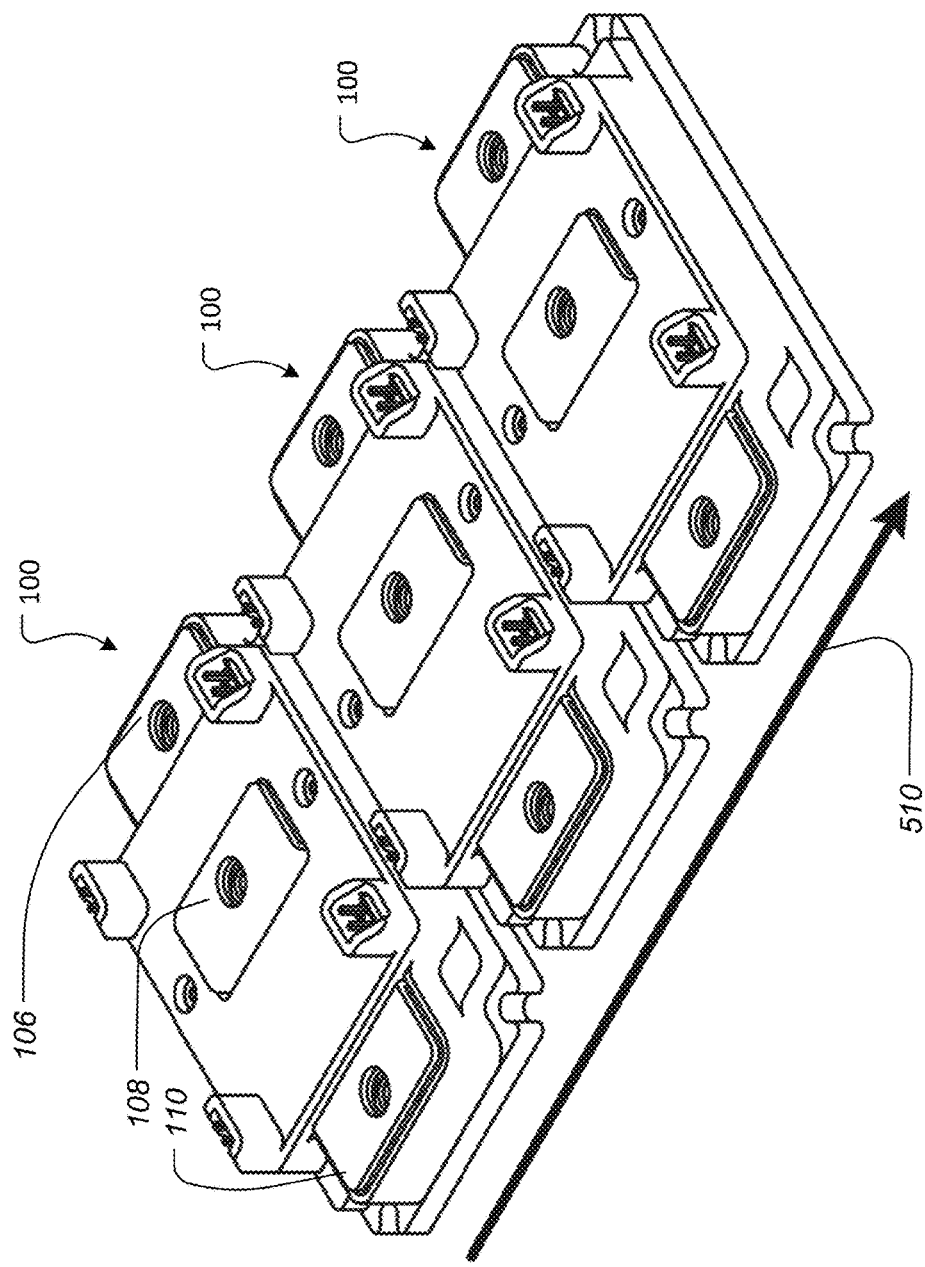
FIG. 18 illustrates a plurality of single-phase modules in a paralleled configuration according to aspects of the disclosure.

FIG. 18 illustrates a plurality of single-phase modules in a paralleled configuration according to aspects of the disclosure.

A single-phase configuration of the power module 100 may be easily paralleled to reach higher currents. As is illustrated in FIG. 19 there are three power modules 100 illustrated, but there is no limit to how many could be configured in this manner. In this regard, arrow 510 shows that additional of the power modules 100 may be arranged in parallel. When paralleled, each of the V+ terminal 106, the V− terminal 108, and the phase output terminal 110 may be electrically connected between each of the power modules 100.

In this regard, the component sequencing process 200 may be applied to each of the power devices 302 for the power module 100. Moreover, the component sequencing process 200 may be applied to each power module 100 utilized in the multiple power module implementation of FIG. 19.

Figure 19B:
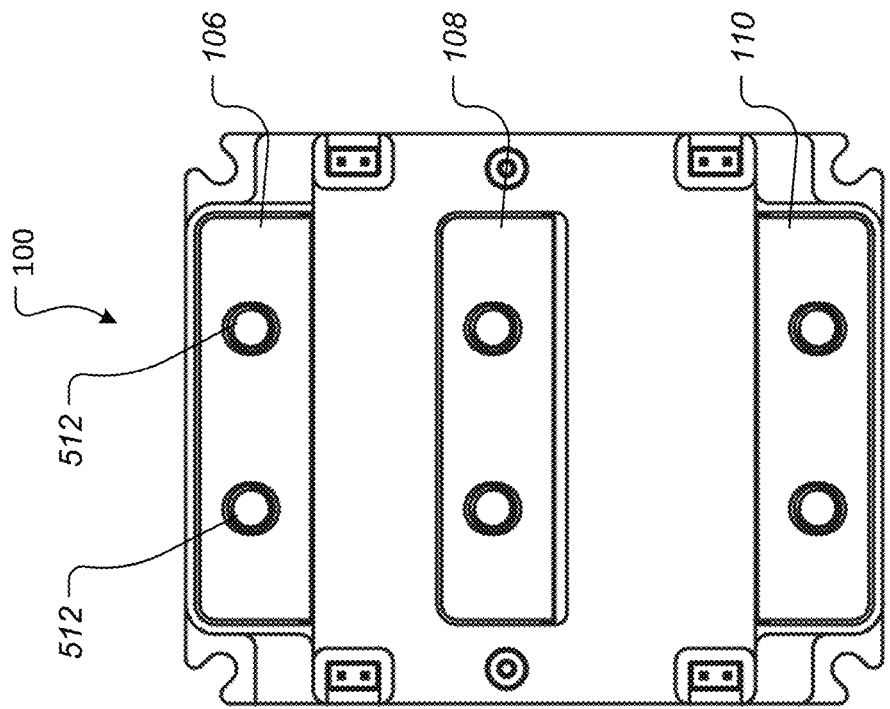
FIG. 19B illustrates a second power module configuration according to aspects of the disclosure.
Figure 19A:
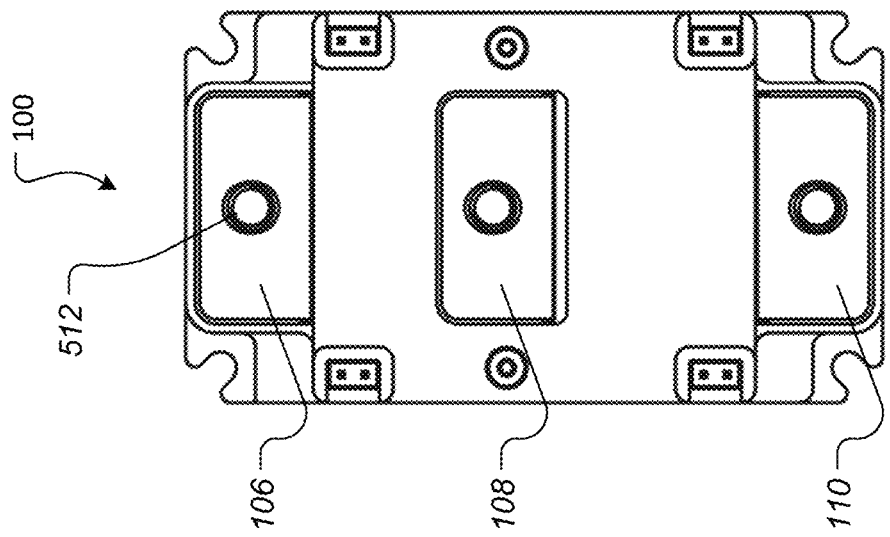
FIG. 19A illustrates a first power module configuration according to aspects of the disclosure.

FIG. 19A illustrates a first power module configuration according to aspects of the disclosure; and FIG. 19B illustrates a second power module configuration according to aspects of the disclosure. Scalability of the disclosed power modules 100 may be another defining feature. This is depicted in FIG. 19A and FIG. 19B. As shown in FIG. 19B, the power module 100 width may be extended to accommodate more paralleled devices for each switch position 104 in comparison to the power module 100 shown in FIG. 19A. Additional ones of the fastener holes 512 may be added to the power contacts of the terminals 106, the V− terminal 108, the phase output terminal 110 due to the increased current of the power module 100. It is important to note that the power modules 100 may be paralleled as shown in FIG. 19 or may be scaled as shown in FIG. 19B to match most power levels without sacrificing the benefits of this disclosure including, for example, low inductance, clean switching, high power density, and/or the like.

In this regard, the component sequencing process 200 may be applied to each of the power devices 302 for the power module 100. Moreover, the component sequencing process 200 may be applied to each power module 100 utilized in a multiple power module implementation of FIG. 19A and FIG. 19B.

Figure 20:
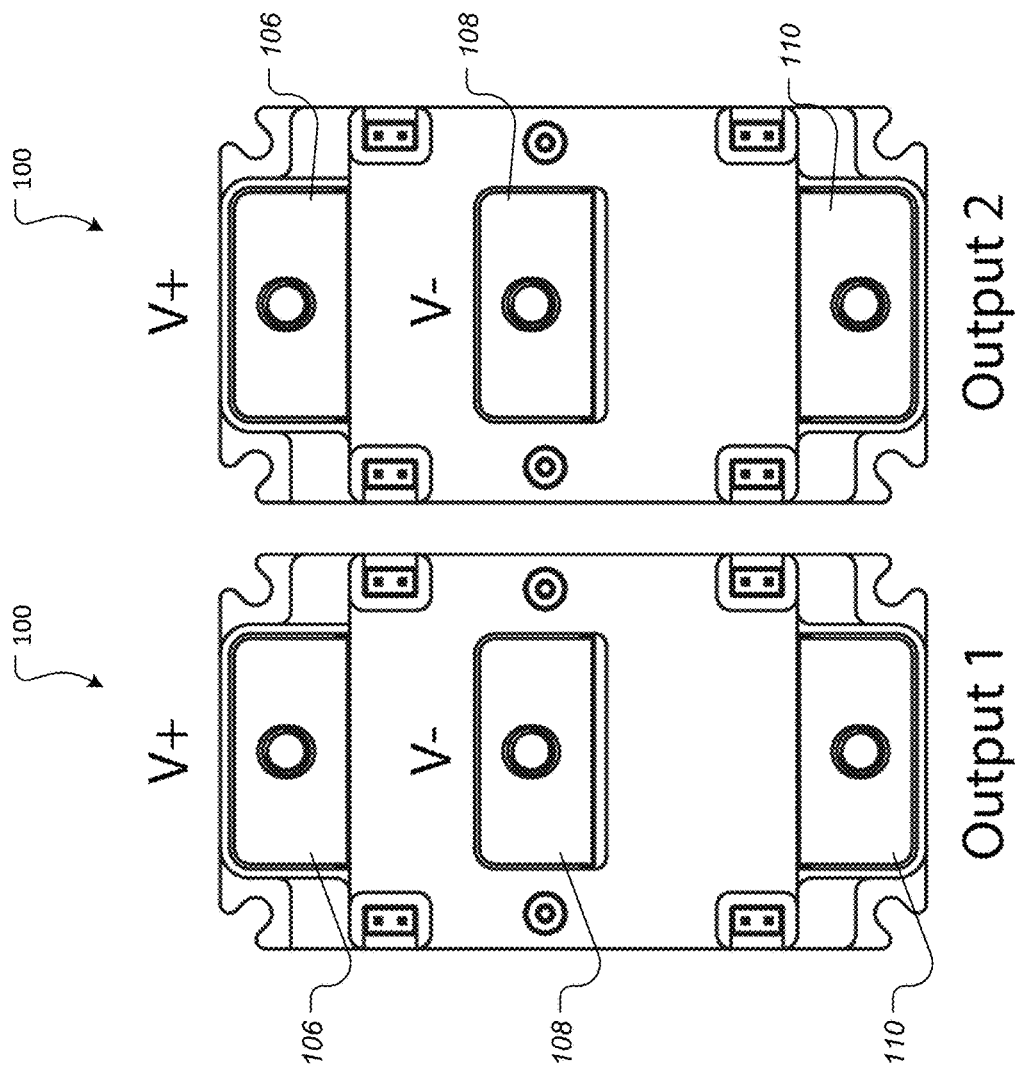
FIG. 20 illustrates power modules in a full bridge configuration according to aspects of the disclosure.
Figure 21:
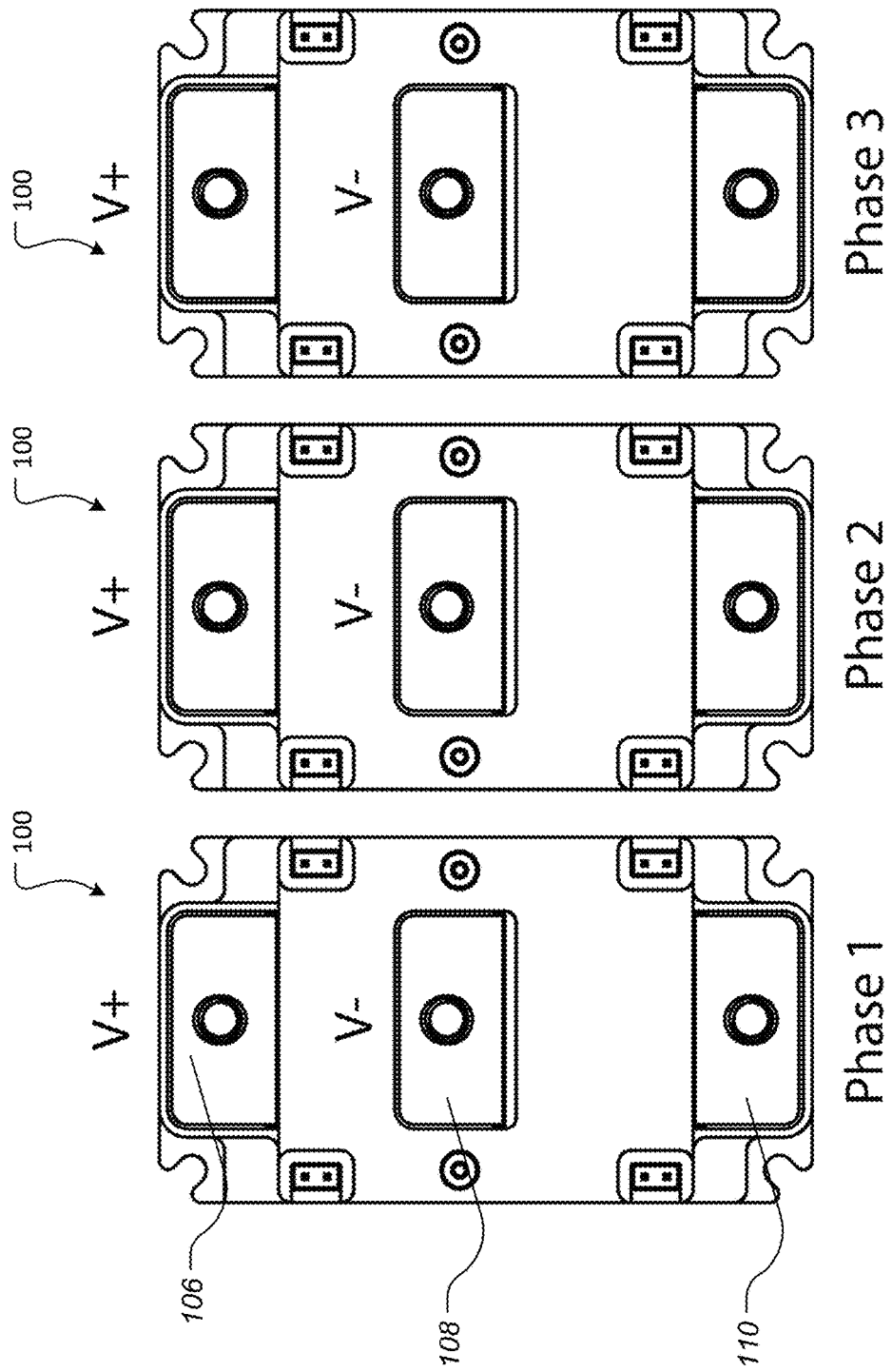
FIG. 21 illustrates a power module in a three-phase configuration according to aspects of the disclosure.
Figure 22:
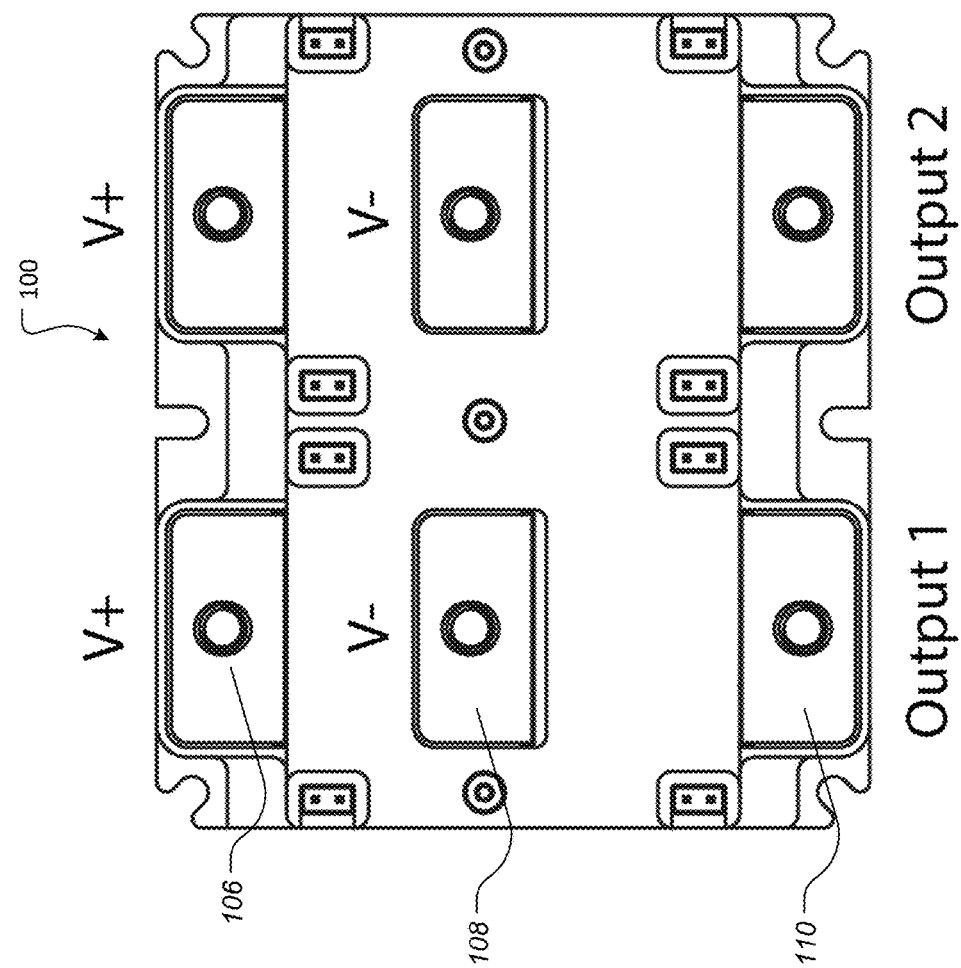
FIG. 22 illustrates a single power module having a full bridge configuration according to aspects of the disclosure.

FIG. 20 illustrates power modules in a full bridge configuration according to aspects of the disclosure; FIG. 21 illustrates a power module in a three-phase configuration according to aspects of the disclosure; and FIG. 22 illustrates a single power module having a full bridge configuration according to aspects of the disclosure.

In some aspects, modularity may also be found in the formation of various electrical topologies, such as FIG. 20 for a full-bridge configuration of two of the power modules 100 and FIG. 21 for a three-phase configuration of three of the power modules 100. For these topologies, the V+ terminal 106 and V− terminal 108 may be interconnected while the phase output terminal 110 may remain separate. The configuration of FIG. 20 and FIG. 21 may also be placed in a single housing and may be configured with a shared base plate as illustrated in FIG. 22, which may increase power density with the tradeoff of higher unit complexity and cost.

In this regard, the component sequencing process 200 may be applied to each of the power devices 302 for the power module 100. Moreover, the component sequencing process 200 may be applied to each power module 100 utilized in a multiple power module implementation of FIG. 20, FIG. 21, and FIG. 22

Referring back to FIG. 16, the power devices 302 may be attached with solder, conductive epoxy, a silver sintering material, and/or the like. In some aspects, the power devices 302, including the gate and source, may additionally be soldered, epoxied, sintered, and/or the like to a second power substrate (not shown). The second power substrate may be utilized in a dual side cooled module implementation. The upper pads on the power devices 302, including the gate and the source, may be wire bonded to their respective locations with power wire bonds 628. The power wire bonds 628 may include aluminum, an aluminum alloy, copper, and/or the like wires, which may be ultrasonically welded, or the like at both feet, forming a conductive arch between two metal pads. Signal bonds 626 may be formed in a similar manner and may be aluminum, gold, copper, and/or the like. In some aspects, the diameter of the wire of the power wire bonds at 626 may be smaller than the wire of the power wire bonds 628.

These elements include one or more of a base plate 602, a gasket 604, one or more power substrates 606, one or more edge power contacts 608, one or more switch positions 104, one or more temperature sensors 610, housing sidewalls 612, a center power contact 614, a signal interconnection assembly 616, a housing lid 618, fasteners 620, captive fasteners 622, and/or the like. In one aspect, the base plate 602 may include a metal. In one aspect, the metal may include copper. Moreover, it is contemplated that the power module 100 may include fewer or different elements than those described herein.

The power module 100 may include the base plate 602. The base plate 602 may provide structural support to the power module 100 as well as facilitating heat spreading for thermal management of the power module 100. The base plate 602 may include a base metal, such as copper, aluminum, and/or the like, or a metal matrix composite (MMC) which may provide coefficient of thermal expansion (CTE) matching to reduce thermally generated stress. In one aspect, the MMC material may be a composite of a high conductivity metal such as copper, aluminum, and/or the like, and either a low CTE metal such as molybdenum, beryllium, tungsten, and/or a nonmetal such as diamond, silicon carbide, beryllium oxide, graphite, embedded pyrolytic graphite, and/or the like. Depending on the material, the base plate 602 may be formed by machining, casting, stamping, and/or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins for direct cooling.

The power module 100 may include the gasket 604. The gasket 604 may improve an encapsulation process by providing a liquid tight seal. In this regard, the power module 100 may include dielectric encapsulation within. The gasket 604 may be injection molded, dispensed, and/or the like, and may be applied in a groove in the housing sidewalls 612 and compressed between the housing sidewalls 612 and the base plate 602.

The power module 100 may include one or more power substrates 606. The one or more power substrates 606 may provide electrical interconnection, voltage isolation, heat transfer, and/or the like for the power devices 302. The one or more power substrates 606 may be constructed as a direct bond copper (DBC), an active metal braze (AMB), an insulated metal substrate (IMS), and/or the like. In the case of the IMS structure, the one or more power substrates 606 and the base plate 602 may be integrated as the same element. In some aspects, the one or more power substrates 606 may be attached to the base plate 602 with solder, thermally conductive epoxy, silver sintering and/or the like. In one aspect there may be two of the power substrates 606, one for each switch position 104.

The power module 100 may include one or more edge power contacts 608. A surface of one of the one or more edge power contacts 608 may form the V+ terminal 106. A surface of one of the one or more edge power contacts 608 may form the phase output terminal 110 or third terminal. The one or more edge power contacts 608 may create a high current path between an external system and the one or more power substrates 606. The one or more edge power contacts 608 may be fabricated from sheet metal through an etching process, a stamping operation, and/or the like. The one or more edge power contacts 608 may have a partial thickness bend assist line 624 to facilitate bending of the one or more edge power contacts 608 to aid in final assembly. In one aspect, the one or more edge power contacts 608 may be folded over the captive fastener 622. In one aspect, the one or more edge power contacts 608 may be soldered, ultrasonically welded, and/or the like directly to the power substrate 606. The one or more edge power contacts 608 may have a metal plating, such as nickel, silver, gold, and/or the like to protect the surfaces and improve solder-ability.

In one aspect, a base 636 of the edge power contact 608 may be split into feet to aid in the attach process. The base 636 may have a metal plating, such as nickel, silver, and/or gold to protect the surfaces and improve solder-ability.

The power module 100 may further include one or more temperature sensors 610. The one or more temperature sensors 610 may be implemented with resistive temperature sensor elements attached directly to the power substrate 606. Other types of temperature sensors are contemplated as well including resistance temperature detectors (RDTs) type sensors, Negative Temperature Coefficient (NTC) type sensors, optical type sensors, thermistors, thermocouples, and/or the like. The one or more temperature sensors 610 may be attached with solder, conductive epoxy, a silver sintering material, and/or the like, and then may be wire bonded to the signal interconnection assembly 616. The power module 100 may further include one or more diagnostic sensors that may include strain gauges sensing vibration, and/or the like. The diagnostic sensors could also determine humidity. Moreover, the diagnostic sensors may sense any environmental or device characteristic.

The power module 100 may further include housing sidewalls 612. The housing sidewalls 612 may be formed of a synthetic material. In one aspect, the housing sidewalls 612 may be an injection molded plastic element. The housing sidewalls 612 may provide electrical insulation, voltage creepage and clearance, structural support, and cavities for holding a voltage and moisture blocking encapsulation. In one aspect, the housing sidewalls 612 may be formed in an injection molding process with reinforced high temperature plastic.

The power module 100 may further include the center power contact 614. A surface of the center power contact 614 may form the V− terminal or the V− terminal 108. The center power contact 614 may create a high current path between an external system and the power devices 302. The center power contact 614 may be fabricated from sheet metal through an etching process, a stamping operation, and/or the like. The center power contact 614 may be isolated from the underlying power substrate 606 by being embedded in the housing sidewalls 612 (as illustrated) or may be soldered or welded to a secondary power substrate as described below. The center power contact 614 may include one or more apertures 632 as shown in FIG. 17 for receiving a corresponding fastener 634 that fastens the center power contact 614 to the housing sidewalls 612.

The low side switch position of the power devices 302 may be wire bonded 640 directly from their terminals to the center power contact 614 as illustrated in FIG. 17. The center power contact 614 may have a partial thickness bend assist line 624 to aid in folding at the final assembly stage. The center power contact 614 may have a metal plating, such as nickel, silver, gold, and/or the like to protect the surfaces and improve bond-ability.

The power module 100 may further include the signal interconnection assembly 616. The signal interconnection assembly may be a gate-source board. The signal interconnection assembly 616 may be a small signal circuit board facilitating electrical connection from the signal contacts to the power devices 302. The signal interconnection assembly 616 may allow for gate and source kelvin connection, as well as connection to additional nodes or internal sensing elements. The signal interconnection assembly 616 may allow for individual gate resistors for each of the power devices 302. The signal interconnection assembly 616 may be a printed circuit board, ceramic circuit board, flex circuit board, embedded metal strips, and/or the like arranged in the housing sidewalls 612. In one aspect, the signal interconnection assembly 616 may include a plurality of assemblies. In one aspect, the signal interconnection assembly 616 may include a plurality of assemblies, one for each switch position 104.

The power module 100 may further include the housing lid 618. The housing lid 618 may be a synthetic element. In one aspect, the housing lid 618 may be an injection molded plastic element. The housing lid 618 may provide electrical insulation, voltage creepage and clearance, and structural support. In this regard, the housing lid 618 together with the housing sidewalls 612 may form a closed assembly. The closed assembly may prevent the ingress of foreign materials from entering the interior of the power module 100. In one aspect, the housing lid 618 may be formed in an injection molding process with reinforced high temperature plastic.

The power module 100 may further include the fasteners 620. The fasteners 620 may be thread forming screws. Other types of fasteners are contemplated as well. The fasteners 620 may be used to screw directly into the housing sidewalls 612 to fasten down multiple elements in the power module 100. The fasteners 620 may be used for housing lid 618 attachment, signal interconnection assembly 616 attachment, embedding the center power contact 614 (if it is not embedded through another means), for fastening the housing sidewalls 612 to the base plate 602, and/or the like.

The power module 100 may further include the captive fasteners 622. The captive fasteners 622 may be hex nuts placed in the housing sidewalls 612 and housing lid 618 and may be held captive underneath the edge power contacts 608 and the center power contact 614 after they are folded over. Other types of fasteners or connectors are contemplated to implement the captive fasteners 622. The captive fasteners 622 may facilitate electrical connection to external buss bars or cables. The captive fasteners 622 may be arranged such that when the power module 100 is bolted to buss bars, the captive fasteners 622 and the edge power contacts 608 are pulled upwards into the bussing, forming a better quality electrical connection. If the captive fasteners 622 were affixed to the housing, they could act to pull the bussing down into the power module 100, which could form a poor connection due to the stiffness of the buss bars.

In one aspect, the housing lid 618 may include an aperture having a shape consistent with the external shape of the captive fasteners 622 to prevent the captive fasteners 622 from rotating. A corresponding fastener may be received by the captive fasteners 622. The corresponding fastener extending through a fastener hole 512 in the center power contact 614 to facilitate electrical connection to external buss bars or cables.

In one aspect, the housing sidewalls 612 may include an aperture having a shape consistent with the external shape of the captive fasteners 622 to prevent the captive fasteners 622 from rotating. A corresponding fastener may be received by the captive fasteners 622. The corresponding fastener extending through a fastener hole 512 in the one or more edge power contacts 608 to facilitate electrical connection to external buss bars or cables.

Referring back to FIG. 15A and FIG. 15B, a power terminal pin-out of a single half-bridge configuration of the power module 100 is depicted in FIG. 15A. The V+ terminal 106 and the V− terminal 108 may be placed intentionally close together (with enough space for voltage clearances) to physically minimize the external current loop to the DC link capacitors.

The power module 100 may include signal terminals 502, 504, 506, 508. The specific pin-out of the signal terminals 502, 504, 506, 508 may be modular and may be modified as necessary. The configuration is illustrated in FIG. 15A. As shown, there are four pairs of signal pins for the signal terminals 502, 504, 506, 508 for differential signal transfer. Of course, any number of signal pins and any number of signal terminals may be implemented to provide the functionality as described in conjunction with the disclosure. Each switch position 104 may utilize a pair of pins with the signal terminal 502 and the signal terminal 504 for the gate signal and a source kelvin for optimal control. The other pin pairs of the signal terminals 506, 508 may be used for an internal temperature sensor, overcurrent sensing, or for other diagnostic signals. It is contemplated that more pins and/or more signal terminals may also be added to any of the rows if necessary, as long as they do not result in voltage isolation issues. In some aspects, the other diagnostic signals may be generated from diagnostic sensors that may include strain gauges sensing vibration, and/or the like. The diagnostic sensors can also determine humidity. Moreover, the diagnostic sensors may sense any environmental or device characteristic. The power module 100 may be implemented and/or configured in a number of different ways. For example, the power module 100 may include implementations having double-sided sintered devices that include two substrates, one on a front and one on a back on a semiconductor device.

In one aspect, one or more of the power modules 100 of FIGS. 17-24 may be inserted into an application, implemented with the application, configured with the application, and/or the like as a system having matched components as set forth by the disclosure. The application may be a system implementing one or more of the power modules 100 of FIGS. 17-24. The application may be a power system, a traction system, a traction motor system, a motor system, an automotive motor system, an automotive traction inverter system, a charging system, an automotive charging system, an automotive battery charging system, an automotive onboard battery charging system, an automotive offboard charging system, a vehicle system, an industrial motor drive, an embedded motor drive, a regenerative motor drive, a robotic servo drive, an uninterruptible power supply, an AC-DC power supply, a DC-AC rectifier, a DC-DC converter, an AC-AC converter, a welder power supply, a military system, an inverter, an inverter for wind turbines, an inverter for solar power panels, an inverter for tidal power plants, an inverter for electric vehicles (EVs), a converter, a pulsed power supply, and/or the like.

Accordingly, the disclosure has provided and described a methods and systems that utilize device sequencing for controlling component mismatch, reducing a need for active logistical oversight, improving performance of devices implementing the components, and/or the like. Moreover, the disclosure has provided and described a methods and systems that may be utilized to deliver customer-matched components, such as power modules, which can be used to realize scalable architectures, such as power module architectures and/or multiple power modules operating in parallel.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprise", "comprises"

"comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the plurality of components 702 in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

Aspects of the disclosure may be implemented in any type of computing devices, such as, e.g., a desktop computer, personal computer, a laptop/mobile computer, a personal data assistant (PDA), a mobile phone, a tablet computer, cloud computing device, and/or the like, with wired/wireless communications capabilities via the communication channels.

Further in accordance with various aspects of the disclosure, the methods described herein are intended for operation with dedicated hardware implementations including, but not limited to, PCs, PDAs, semiconductors, application specific integrated circuits (ASIC), programmable logic arrays, cloud computing devices, and other hardware devices constructed to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

Additionally, the various aspects of the disclosure may be implemented in a non-generic computer implementation. Moreover, the various aspects of the disclosure set forth herein improve the functioning of the system as is apparent from the disclosure hereof. Furthermore, the various aspects of the disclosure involve computer hardware that it specifically programmed to solve the complex problem addressed by the disclosure. Accordingly, the various aspects of the disclosure improve the functioning of the system overall in its specific implementation to perform the process set forth by the disclosure and as defined by the claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and/or the like are contemplated to be interchangeable, mixed, matched, combined, and/or the like. In this regard, the different features of the disclosure are modular and can be mixed and matched with each other.

What is claimed is:

1. A power module, comprising:
   at least one electrically conductive power substrate;
   a housing arranged on the at least one electrically conductive power substrate; and
   a plurality of power devices arranged on and connected to the at least one electrically conductive power substrate,
   wherein each of the plurality of power devices are arranged in a sequential order based on at least one component parameter such that a variation of the at least one component parameter between adjacent pairs of the power devices in the sequential order is minimized;
   wherein the plurality of power devices are configured as an array of paralleled devices on the at least one electrically conductive power substrate;
   wherein the plurality of power devices comprise at least one of the following: a MEtal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a static induction transistor (SiT), a High-Electron-Mobility Transistor (HEMT), a metal insulator semiconductor FET (MISFET), a Thyristor, a Gate Turn-Off Thyristor (GTO), an Integrated Gate-Commutated Thyristor (IGCT), and/or a diode:
   wherein the sequential order of the plurality of power devices comprises at least one of the following: an Ascending-Descending Sequencing (ADS) where the plurality of power devices are sequenced from a low value of the at least one component parameter to a high value of the at least one component parameter or a high value of the at least one component parameter to a low value of the at least one component parameter, a Half-Sine Sequencing (HSS) where the plurality of power devices are sequenced to start and end with a low value of the at least one component parameter, a Half-Sine Sequencing (HSS) where the plurality of power devices are sequenced to start and end with a high value of the at least one component parameter, and a Full-Sine Sequencing (FSS) where the plurality of power devices are sequenced to start and end with a median value of the at least one component parameter; and wherein the at least one component parameter comprises at least one of the following for each of the plurality of power devices: a threshold voltage, an on-state resistance, a static conduction characteristic, a dynamic switching characteristic, a drain current magnitude, a transconductance, a gate threshold voltage, a gate-source leakage current, a drain-source leakage current, a drain-source on-state resistance, a total gate charge, a gate-source charge, a gate-drain charge, an input capacitance, a reverse transfer capacitance, a gate resistance, a turn-on delay time, a turn-on rise time, a turn-off delay time, a turn-off fall time, a forward voltage, a reverse recovery time, a reverse recovery charge, a turn-on drain current, a drain-source current, a gate-source voltage, a transfer function, a drain-source voltage, a pulsed drain current, a DC body diode forward current, a pulsed body diode current, a max transient voltage, a turn-off gate voltage, a power dissipation, a virtual function temperature, a body diode thermal resistance, a thermal resistance, a body diode forward voltage, a gate-source threshold voltage, a zero-gate voltage drain current, an internal gate resistance, an output capacitance, a reverse capacitance, a stored energy, a rise time, a fall time, a turn-on energy, a turn-off energy, a total switching energy, a diode reverse recovery charge, a diode peak reverse recovery current, a resistance, a capacitance, resonant points, an inductance, transfer data, parametric data, data characterizing static losses, a device transfer curve, a transfer function, data representative of an independent scalar input versus a dependent scalar output, time domain waveforms, and/or data characterizing dynamic losses.

2. The power module of claim 1,
wherein the plurality of power devices comprise power semiconductor devices that comprise at least one of the following: Silicon Carbide (SiC) MOSFETs, Silicon Carbide (SiC) JFETs, Silicon Carbide (SiC) IGBTs, Silicon Carbide (SiC) Schottky Diodes, and Gallium Nitride (GaN) HEMTs.

3. The power module of claim 1,
wherein the plurality of power devices comprise wide band gap power semiconductor devices that comprise at least one of the following: Silicon Carbide (SiC) MOSFETs, Silicon Carbide (SiC) JFETs, Silicon Carbide (SiC) IGBTs, Silicon Carbide (SiC) Schottky Diodes, and Gallium Nitride (GaN) HEMTs.

4. The power module of claim 1,
wherein the plurality of power devices comprise devices fabricated from wide bandgap materials that comprise at least one of the following: Gallium Nitride (GaN) and Silicon Carbide (SiC).

5. The power module of claim 1, further comprising:
a first terminal electrically connected to the at least one electrically conductive power substrate;
a second terminal;
a third terminal electrically connected to the at least one electrically conductive power substrate; and
a base plate.

6. The power module of claim 1, wherein the sequential order of the plurality of power devices comprises the Ascending-Descending Sequencing (ADS) where the plurality of power devices are sequenced from a low value of the at least one component parameter to a high value of the at least one component parameter or a high value of the at least one component parameter to a low value of the at least one component parameter.

7. The power module of claim 1, wherein the sequential order of the plurality of power devices comprises the Half-Sine Sequencing (HSS) where the plurality of power devices are sequenced to start and end with a low value of the at least one component parameter.

8. The power module of claim 1, wherein the sequential order of the plurality of power devices comprises the Half-Sine Sequencing (HSS) where the plurality of power devices are sequenced to start and end with a high value of the at least one component parameter.

9. The power module of claim 1, wherein the sequential order of the plurality of power devices comprises the Full-Sine Sequencing (FSS) where the plurality of power devices are sequenced to start and end with a median value of the at least one component parameter.

10. A system comprising a plurality of the power modules according to claim 1, wherein:
each of the plurality of the power modules comprise a subset of the plurality of power devices that are arranged in a sequential order based on at least one component parameter such that the sequential order of the plurality of power devices ensures that a variation of the at least one component parameter between adjacent pairs of the power devices in the sequential order is minimized; and
a variation of the at least one component parameter between the plurality of the power modules is minimized.

11. The power module of claim 1, wherein the plurality of power devices comprise at least three power devices.

12. The power module of claim 11, wherein the at least one component parameter comprises a plurality of the at least one component parameter for each of the plurality of power devices.

13. A power module, comprising:
at least one power substrate;
a housing arranged on the at least one power substrate; and
a plurality of power devices arranged on to the at least one power substrate,
wherein each of the plurality of power devices are arranged in a sequential order based on at least one component parameter such that a variation of the at least one component parameter between adjacent pairs of the power devices in the sequential order is minimized;
wherein the plurality of power devices are configured as an array of paralleled devices on the at least one power substrate;
wherein the plurality of power devices comprise at least one of the following: a MEtal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a static induction transistor (SiT), a High-Electron-Mobility Transistor (HEM T), a metal insulator semiconductor FET (MISFET), a Thyristor, a Gate Turn-Off Thyristor (GTO), an Integrated Gate-Commutated Thyristor (IGCT), and/or a diode; and
wherein the at least one component parameter comprises at least one of the following for each of the plurality of power devices: a threshold voltage, an on-state resistance, a static conduction characteristic, a dynamic switching characteristic, a drain current magnitude, a transconductance, a gate threshold voltage, a gate-source leakage current, a drain-source leakage current, a drain-source on-state resistance, a total gate charge, a gate-source charge, a gate-drain charge, an input capacitance, a reverse transfer capacitance, a gate resistance, a turn-on delay time, a turn-on rise time, a turn-off delay time, a turn-off fall time, a forward voltage, a reverse recovery time, a reverse recovery charge, a turn-on drain current, a drain-source current, a gate-source voltage, a transfer function, a drain-source voltage, a pulsed drain current, a DC body diode forward current, a pulsed body diode current, a max transient voltage, a turn-off gate voltage, a power dissipation, a virtual function temperature, a body diode thermal resistance, a thermal resistance, a body diode forward voltage, a gate-source threshold voltage, a zero-gate voltage drain current, an internal gate resistance, an output capacitance, a reverse capacitance, a stored energy, a rise time, a fall time, a turn-on energy, a turn-off energy, a total switching energy, a diode reverse recovery charge, a diode peak reverse recovery current, a resistance, a capacitance, resonant points, an inductance, transfer data, parametric data, data characterizing static losses, a device transfer curve, a transfer function, data representative of an independent scalar input versus a dependent scalar output, time domain waveforms, and/or data characterizing dynamic losses.

14. The power module of claim 13,
wherein the plurality of power devices comprise power semiconductor devices that comprise at least one of the following: Silicon Carbide (SiC) MOSFETs, Silicon Carbide (SiC) JFETs, Silicon Carbide (SiC) IGBTs, Silicon Carbide (SiC) Schottky Diodes, and Gallium Nitride (GaN) HEMTs.

15. The power module of claim 13,
wherein the plurality of power devices comprise wide band gap power semiconductor devices that comprise at least one of the following: Silicon Carbide (SiC) MOSFETs, Silicon Carbide (SiC) JFETs, Silicon Carbide (SiC) IGBTs, Silicon Carbide (SiC) Schottky Diodes, and Gallium Nitride (GaN) HEMTs.

16. The power module of claim 13,
wherein the plurality of power devices comprise devices fabricated from wide bandgap materials that comprise at least one of the following: Gallium Nitride (GaN) and Silicon Carbide (SiC).

17. The power module of claim 13, further comprising:
a first terminal electrically connected to the at least one power substrate;
a second terminal;
a third terminal electrically connected to the at least one power substrate; and
a base plate.

18. The power module of claim 13, wherein the sequential order of the plurality of power devices comprises at least one of the following: an Ascending-Descending Sequencing (ADS) where the plurality of power devices are sequenced from a low value of the at least one component parameter to a high value of the at least one component parameter or a high value of the at least one component parameter to a low value of the at least one component parameter, a Half-Sine Sequencing (HSS) where the plurality of power devices are sequenced to start and end with a low value of the at least one component parameter, a Half-Sine Sequencing (HSS) where the plurality of power devices are sequenced to start and end with a high value of the at least one component parameter, and a Full-Sine Sequencing (FSS) where the plurality of power devices are sequenced to start and end with a median value of the at least one component parameter.

19. The power module of claim 13, wherein the sequential order of the plurality of power devices comprises an Ascending-Descending Sequencing (ADS) where the plurality of power devices are sequenced from a low value of the at least one component parameter to a high value of the at least one component parameter or a high value of the at least one component parameter to a low value of the at least one component parameter.

20. The power module of claim 13, wherein the sequential order of the plurality of power devices comprises a Half-Sine Sequencing (HSS) where the plurality of power devices are sequenced to start and end with a low value of the at least one component parameter.

21. The power module of claim 13, wherein the sequential order of the plurality of power devices comprises a Half-Sine Sequencing (HSS) where the plurality of power devices are sequenced to start and end with a high value of the at least one component parameter.

22. The power module of claim 13, wherein the sequential order of the plurality of power devices comprises a Full-Sine Sequencing (FSS) where the plurality of power devices are sequenced to start and end with a median value of the at least one component parameter.

23. A system comprising a plurality of the power modules according to claim 13, wherein:
each of the plurality of the power modules comprise a subset of the plurality of power devices that are arranged in a sequential order based on at least one component parameter such that the sequential order of the plurality of power devices ensures that a variation of the at least one component parameter between adjacent pairs of the power devices in the sequential order is minimized; and
a variation of the at least one component parameter between the plurality of the power modules is minimized.

24. The power module of claim 13, wherein the plurality of power devices comprise at least three power devices.

25. The power module of claim 24, wherein the at least one component parameter comprises a plurality of the at least one component parameter for each of the plurality of power devices.

26. A power module, comprising:
at least one power substrate;
a housing arranged on the at least one power substrate;
a plurality of power terminals; and
a plurality of power devices arranged on to the at least one power substrate, wherein each of the plurality of power devices are arranged as an array of paralleled devices in a sequential order based on at least one component parameter; and
wherein each of the plurality of power devices are arranged in the sequential order based on the at least one component parameter such that the sequential order of the plurality of power devices ensures that a variation of the at least one component parameter between adjacent pairs of the power devices in the sequential order is minimized;
wherein the plurality of power devices comprise at least one of the following: a MEtal Semiconductor Field- Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a static induction transistor (SiT), a High-Electron-Mobility Transistor (HEMT), a metal insulator semiconductor FET (MISFET), a Thyristor, a Gate Turn-Off Thyristor (GTO), an Integrated Gate-Commutated Thyristor (IGCT), and/or a diode; and wherein the at least one component parameter comprises at least one of the following for each of the plurality of power devices: a threshold voltage, an on-state resistance, a static conduction characteristic, a dynamic switching characteristic, a drain current magnitude, a transconductance, a gate threshold voltage, a gate-source leakage current, a drain-source leakage current, a drain-source on-state resistance, a total gate charge, a gate-source charge, a gate-drain charge, an input capacitance, a reverse transfer capacitance, a gate resistance, a turn-on delay time, a turn-on rise time, a turn-off delay time, a turn-off fall time, a forward voltage, a reverse recovery time, a reverse recovery charge, a turn-on drain current, a drain-source current, a gate-source voltage, a transfer function, a drain-source voltage, a pulsed drain current, a DC body diode forward current, a pulsed body diode current, a max transient voltage, a turn-off gate voltage, a power dissipation, a virtual function temperature, a body diode thermal resistance, a thermal resistance, a body diode forward voltage, a gate-source threshold voltage, a zero-gate voltage drain current, an internal gate resistance, an output capacitance, a reverse capacitance, a stored energy, a rise time, a fall time, a turn-on energy, a turn-off energy, a total switching energy, a diode reverse recovery charge, a diode peak reverse recovery current, a resistance, a capacitance, resonant points, an inductance, transfer data parametric data, data characterizing static losses, a device transfer curve, a transfer function, data representative of an independent scalar input versus a dependent scalar output, time domain waveforms, and/or data characterizing dynamic losses.

27. The power module of claim 26, wherein the plurality of power devices comprise power semiconductor devices that comprise at least one of the following: Silicon Carbide (SiC) MOSFETs, Silicon Carbide (SiC) JFETs, Silicon Carbide (SiC) IGBTs, Silicon Carbide (SiC) Schottky Diodes, and Gallium Nitride (GaN) HEMTs.

28. The power module of claim 26, wherein the plurality of power devices comprise at least three power devices.

29. The power module of claim 28, wherein the at least one component parameter comprises a plurality of the at least one component parameter for each of the plurality of power devices.

* * * * *